(12) United States Patent
Mizunoura et al.

(10) Patent No.: US 10,955,743 B2
(45) Date of Patent: Mar. 23, 2021

(54) SUBSTRATE PROCESSING APPARATUS, SUBSTRATE PROCESSING METHOD AND COMPUTER-READABLE RECORDING MEDIUM

(71) Applicant: TOKYO ELECTRON LIMITED, Tokyo (JP)

(72) Inventors: Hiroshi Mizunoura, Koshi (JP); Yohei Sano, Koshi (JP); Shinichiro Kawakami, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/376,192

(22) Filed: Apr. 5, 2019

(65) Prior Publication Data
US 2019/0317407 A1 Oct. 17, 2019

(30) Foreign Application Priority Data

Apr. 11, 2018 (JP) .............................. JP2018-076288

(51) Int. Cl.
*G03F 7/16* (2006.01)
*C23F 1/02* (2006.01)

(52) U.S. Cl.
CPC ................ *G03F 7/168* (2013.01); *C23F 1/02* (2013.01)

(58) Field of Classification Search
CPC .................................. G03F 7/168; C23F 1/02
See application file for complete search history.

(56) References Cited

U.S. PATENT DOCUMENTS

| 7,223,690 B2 * | 5/2007 | Kondo | B24B 37/005 |
| | | | 257/E21.174 |
| 2018/0147599 A1 * | 5/2018 | Tanaka | H01L 21/67178 |

FOREIGN PATENT DOCUMENTS

| JP | 2016-029498 A | 3/2016 | |
| WO | WO-2016194285 A1 * | 12/2016 | B05D 3/10 |

* cited by examiner

*Primary Examiner* — Dah-Wei D. Yuan
*Assistant Examiner* — Kristen A Dagenais-Englehart
(74) *Attorney, Agent, or Firm* — Nath, Goldberg & Meyer; Jerald L. Meyer

(57) ABSTRACT

There is provided a substrate processing apparatus, including: a film forming part configured to form a metal-containing film on a front surface of a substrate; a film cleaning part configured to clean the metal-containing film formed on a peripheral edge portion of the substrate; and a controller. The controller is configured to control the film forming part so as to form the metal-containing film on the front surface of the substrate, and control the film cleaning part so as to supply a first chemical liquid and a second chemical liquid.

3 Claims, 22 Drawing Sheets

SUBSTRATE PROCESSING APPARATUS, SUBSTRATE PROCESSING METHOD AND COMPUTER-READABLE RECORDING MEDIUM

CROSS-REFERENCE TO RELATED APPLICATION

This application is based upon and claims the benefit of priority from Japanese Patent Application No. 2018-076288, filed on Apr. 11, 2018, the entire contents of which are incorporated herein by reference.

TECHNICAL FIELD

The present disclosure relates to a substrate processing apparatus, a substrate processing method and a non-transitory computer-readable recording medium.

BACKGROUND

For example, there is known a substrate processing method of forming a layer of a coating material containing a metal (hereinafter referred to as "metal-containing film") on a substrate.

SUMMARY

Some embodiments of the present disclosure provide a substrate processing apparatus, a substrate processing method and a non-transitory computer-readable recording medium, which are capable of suppressing metal contamination attributable to the use of a metal-containing film.

According to one embodiment of the present disclosure, there is provided a substrate processing apparatus, including: a film forming part configured to form a metal-containing film on a front surface of a substrate; a film cleaning part configured to clean the metal-containing film formed on a peripheral edge portion of the substrate; and a controller, wherein the controller is configured to execute: controlling the film forming part so as to form the metal-containing film on the front surface of the substrate; controlling the film cleaning part so as to supply a first chemical liquid having a function of dissolving the metal-containing film to a first position in the peripheral edge portion of the substrate; and controlling the film cleaning part so as to supply a second chemical liquid having a function of dissolving the metal-containing film to a second position in the peripheral edge portion of the substrate after the metal-containing film dissolved by the first chemical liquid is dried, the second position being closer to a periphery of the substrate than the first position.

According to another embodiment of the present disclosure, there is provided a substrate processing method, including: forming a metal-containing film on a front surface of a substrate; supplying a first chemical liquid having a function of dissolving the metal-containing film to a first position in a peripheral edge portion of the substrate; and supplying a second chemical liquid having a function of dissolving the metal-containing film to a second position in the peripheral edge portion of the substrate, the second position being closer to a periphery of the substrate than the first position.

According to another embodiment of the present disclosure, there is provided a non-transitory computer-readable storage medium storing a program that causes a substrate processing apparatus to execute the aforementioned method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
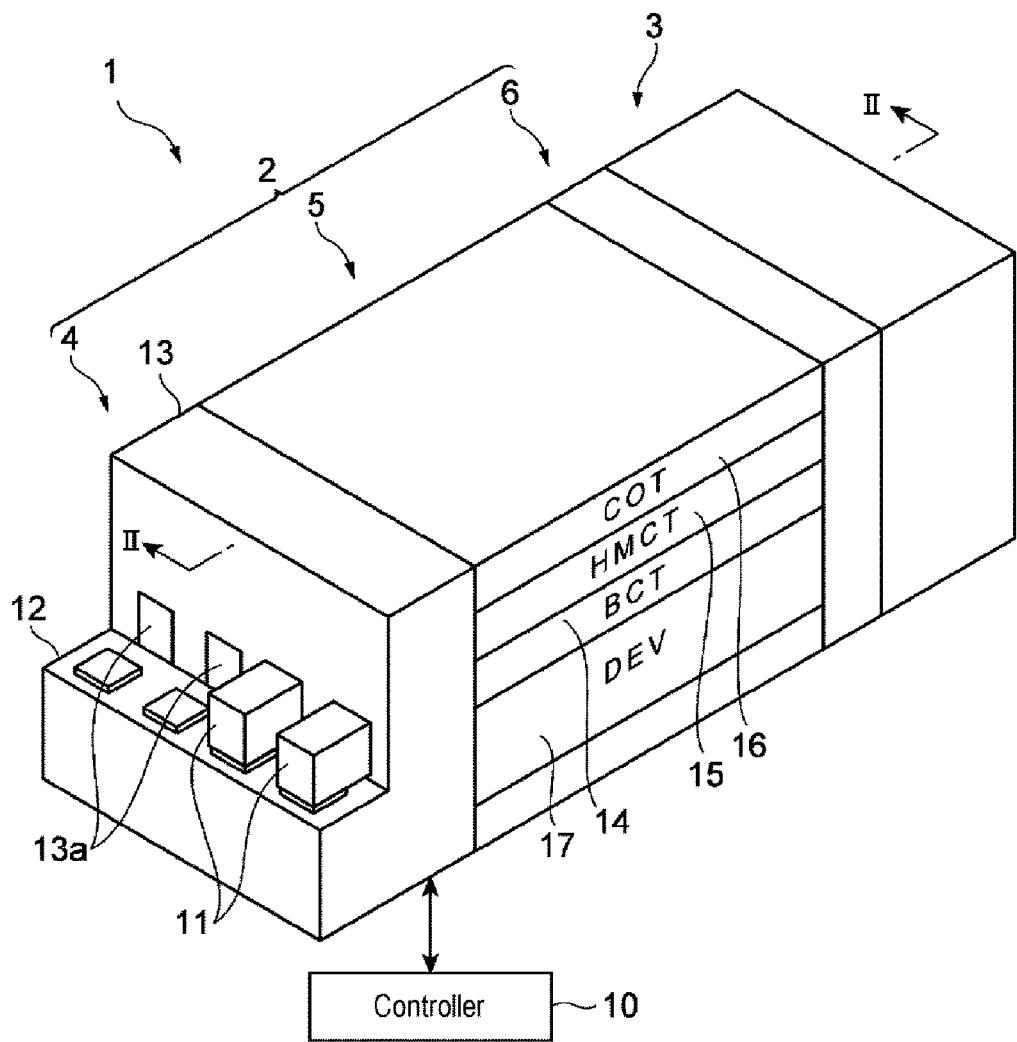
FIG. 1 is a perspective view showing a schematic configuration of a substrate processing system according to the present embodiment.

An example of an embodiment according to the present disclosure will be described in more detail below with reference to the drawings. In the following description, the same reference numerals will be used for the same elements or elements having the same function, and redundant description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing System]

As shown in FIG. 1, a substrate processing system 1 (substrate processing apparatus) includes a coating/developing apparatus 2, an exposure apparatus 3 and a controller 10 (control part). The exposure apparatus 3 performs exposure process (pattern exposure) on a resist film formed on a front surface of a wafer W (substrate). Specifically, an energy ray is selectively irradiated to an exposure target portion of the resist film (photosensitive film) by a method such as liquid immersion exposure or the like. Examples of the energy ray include ArF excimer laser, KrF excimer laser, g-ray, i-ray and extreme ultraviolet (EUV).

The coating/developing apparatus 2 performs a process of forming the resist film on the front surface of the wafer W before the exposure process by the exposure apparatus 3 and performs a developing process on the resist film after the exposure process. The wafer W may have a disc shape, a partially cutaway circular shape, or a shape other than a circular shape, such as a polygonal shape or the like. The wafer W may be, for example, a semiconductor substrate, a glass substrate, a mask substrate, an FPD (Flat Panel Display) substrate or any other various substrates. The diameter of the wafer W may be, for example, about 200 mm to 450 mm.

Figure 2:
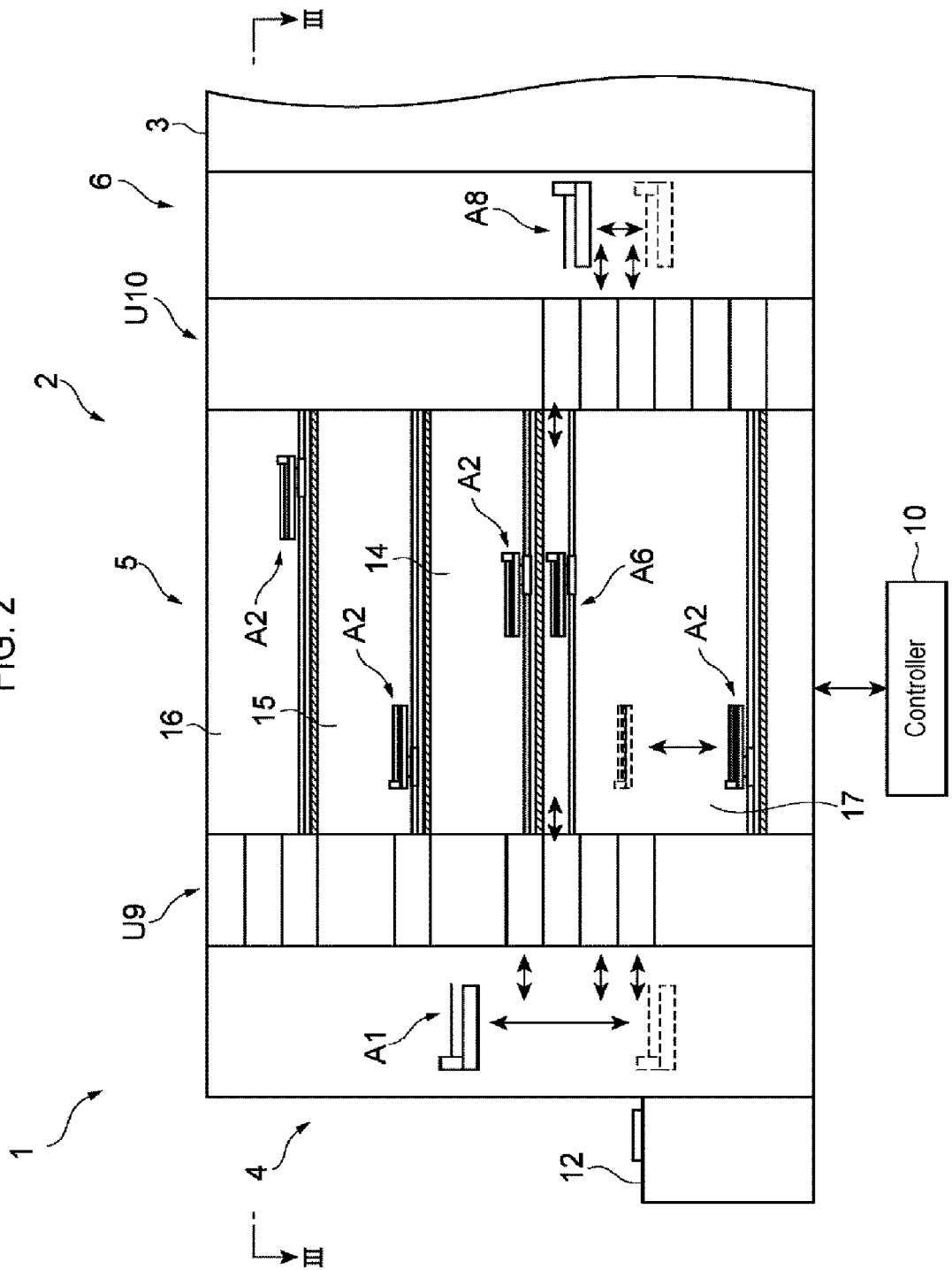
FIG. 2 is a sectional view taken along line II-II in FIG. 1.
Figure 3:
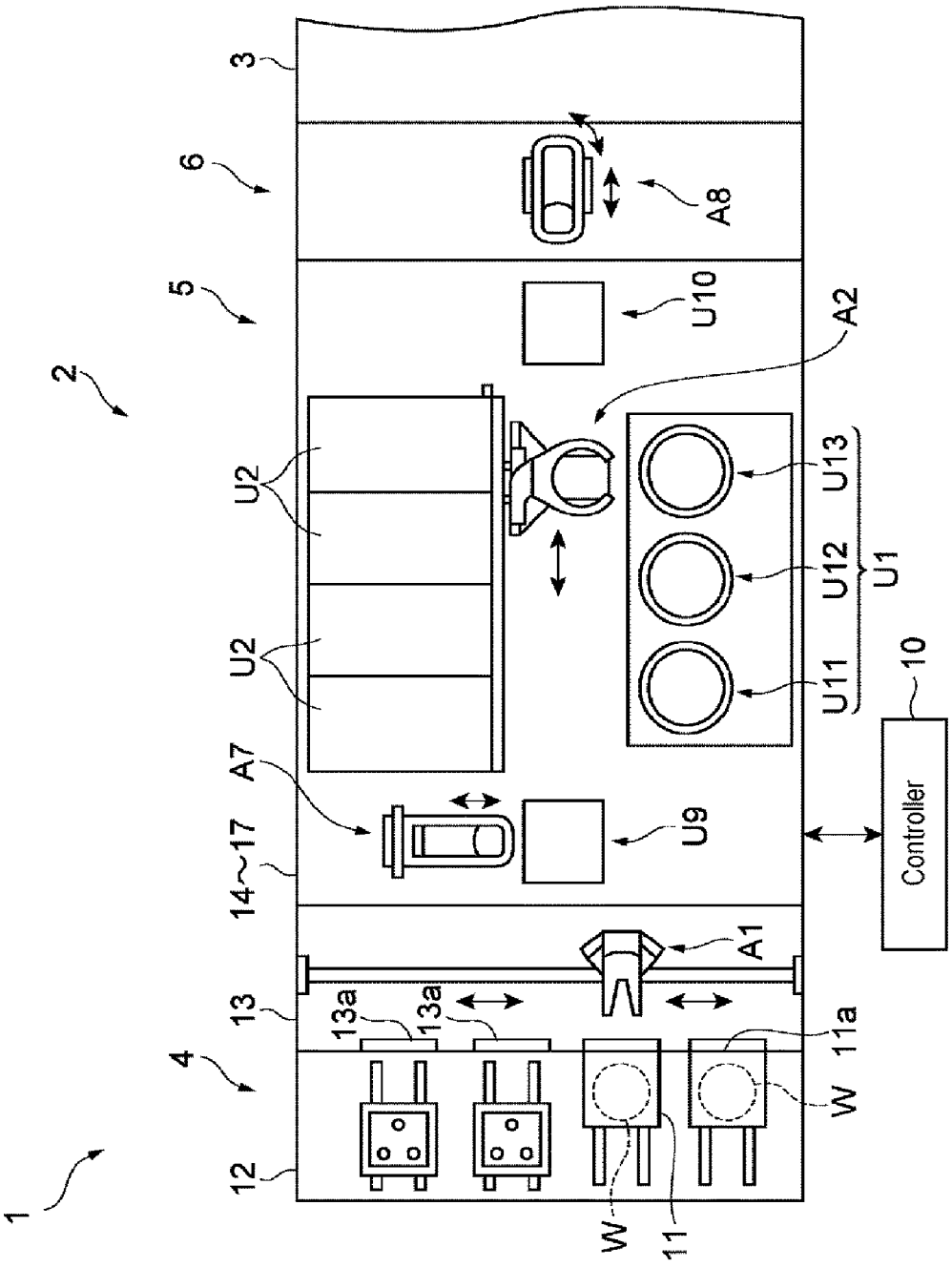
FIG. 3 is a sectional view taken along line in FIG. 2.

As shown in FIGS. 1 to 3, the coating/developing apparatus 2 includes a carrier block 4, a processing block 5 and an interface block 6. The carrier block 4, the processing block 5 and the interface block 6 are arranged side by side in a horizontal direction.

As shown in FIGS. 1 and 3, the carrier block 4 includes a carrier station 12 and a loading/unloading part 13. The carrier station 12 supports a plurality of carriers 11. Each of the carriers 11 accommodates at least one wafer W in a sealed state. On a side surface 11a of the carrier 11, there is provided an opening/closing door (not shown) through which the wafer W is transferred. The carrier 11 is removably installed on the carrier station 12 so that the side surface 11a faces the loading/unloading part 13.

The loading/unloading part 13 is located between the carrier station 12 and the processing block 5. The loading/unloading part 13 includes a plurality of opening/closing doors 13a. When the carrier 11 is placed on the carrier station 12, the opening/closing door of the carrier 11 faces the respective opening/closing door 13a. By simultaneously opening the opening/closing door 13a and the opening/closing door of the side surface 11a, the interior of the carrier 11 and the interior of the loading/unloading part 13 are in communication with each other. The loading/unloading part 13 incorporates a transfer arm A1 therein. The transfer arm A1 is configured to take out the wafer W from the carrier 11 and transfer the wafer W to the processing block 5. Furthermore, the transfer arm A1 is configured to receive the wafer W from the processing block 5 and return the wafer W to the interior of the carrier 11.

As shown in FIGS. 1 and 2, the processing block 5 includes modules 14 to 17. These modules are arranged in the order of the module 17, the module 14, the module 15 and the module 16 from the floor surface side. As shown in FIGS. 2 and 3, each of the modules 14 to 17 incorporates a plurality of liquid processing units U1, a plurality of heat treatment units U2 and a transfer arm A2 for transferring the wafer W to these units. The liquid processing unit U1 is configured to form a coating film by coating a processing liquid on the front surface of the wafer W. The heat treatment unit U2 incorporates, for example, a heating plate and a cooling plate. The heat treatment unit U2 is configured to perform a heat treatment by heating the wafer W with the heating plate and cooling the heated wafer W with the cooling plate.

The module 14 is configured to form a lower layer film on the front surface of the wafer W and is also called a BCT module. The liquid processing unit U1 of the module 14 is configured to coat a coating liquid for forming the lower layer film on the front surface of the wafer W. The heat treatment unit U2 of the module 14 is configured to perform a heat treatment for curing the coating film to form the lower layer film. An example of the lower layer film is an antireflection (SiARC) film. However, the illustration of the lower layer film is omitted in the figures.

The module 15 is configured to form an intermediate film (hard mask) on the lower layer film and is also called an HMCT module. The liquid processing unit U1 of the module 15 is configured to coat a coating liquid for forming the intermediate film on the front surface of the wafer W. The heat treatment unit U2 of the module 15 is configured to perform a heat treatment for curing a coating film to form the intermediate film. Examples of the intermediate film include an SOC (Spin-On-Carbon) film and an amorphous carbon film. However, the illustration of the intermediate film is omitted in the figures.

The module 16 is configured to form a photosensitive thermosetting resist film on the intermediate film and is also called a COT module. The liquid processing unit U1 of the module 16 is configured to coat a processing liquid (resist agent) for forming a resist film on the intermediate film. The heat treatment unit U2 of the module 16 is configured to perform a heat treatment (PAB: Pre Applied Bake) for curing a coating film to form the resist film.

The module 17 is configured to perform a developing process on an exposed resist film and is also called a DEV module. The module 17 further incorporates a transfer arm A6 that directly transfers the wafer W between shelf units U9 and U10 (to be described later) without bypassing the liquid processing unit U1 and the heat treatment unit U2. The liquid processing unit U1 of the module 17 is configured to partially remove the resist film to form a resist pattern. The heat treatment unit U2 of the module 17 is configured to perform a heat treatment (PEB: Post Exposure Bake) before the developing process, a heat treatment (PB: Post Bake) after the developing process, and the like.

As shown in FIGS. 2 and 3, the shelf unit U9 is provided at the side of the carrier block 4 in the processing block 5. The shelf unit U9 is provided so as to extend from the floor surface to the module 15 and is divided into a plurality of cells arranged in a vertical direction. A transfer arm A7 is provided near the shelf unit U9. The transfer arm A7 raises or lowers the wafer W between the cells of the shelf unit U9.

The shelf unit U10 is provided at the side of the interface block 6 in the processing block 5. The shelf unit U10 is provided so as to extend from the floor surface to the upper portion of the module 17 and is divided into a plurality of cells arranged in a vertical direction.

The interface block 6 incorporates a transfer arm A8 and is connected to the exposure apparatus 3. The transfer arm A8 is configured to take out the wafer W from the shelf unit U10 and transfer the wafer W to the exposure apparatus 3. Furthermore, the transfer arm A8 is configured to receive the wafer W from the exposure apparatus 3 and return the wafer W to the shelf unit U10.

The controller 10 partially or totally controls the substrate processing system 1. Details of the controller 10 will be described later.

[Configuration of Liquid Processing Unit]

With reference to FIG. 3 to FIG. 6, the configuration of the liquid processing unit U1 will be described in detail. In the present embodiment, the liquid processing unit U1 of the module 16 will be described as an example of the liquid processing unit U1. As shown in FIG. 3, each of the liquid processing units U1 includes a liquid processing unit U11 for forming a protective film, a liquid processing unit U12 for forming and cleaning a film, and a liquid processing unit U13 for cleaning the protective film.

Figure 4:
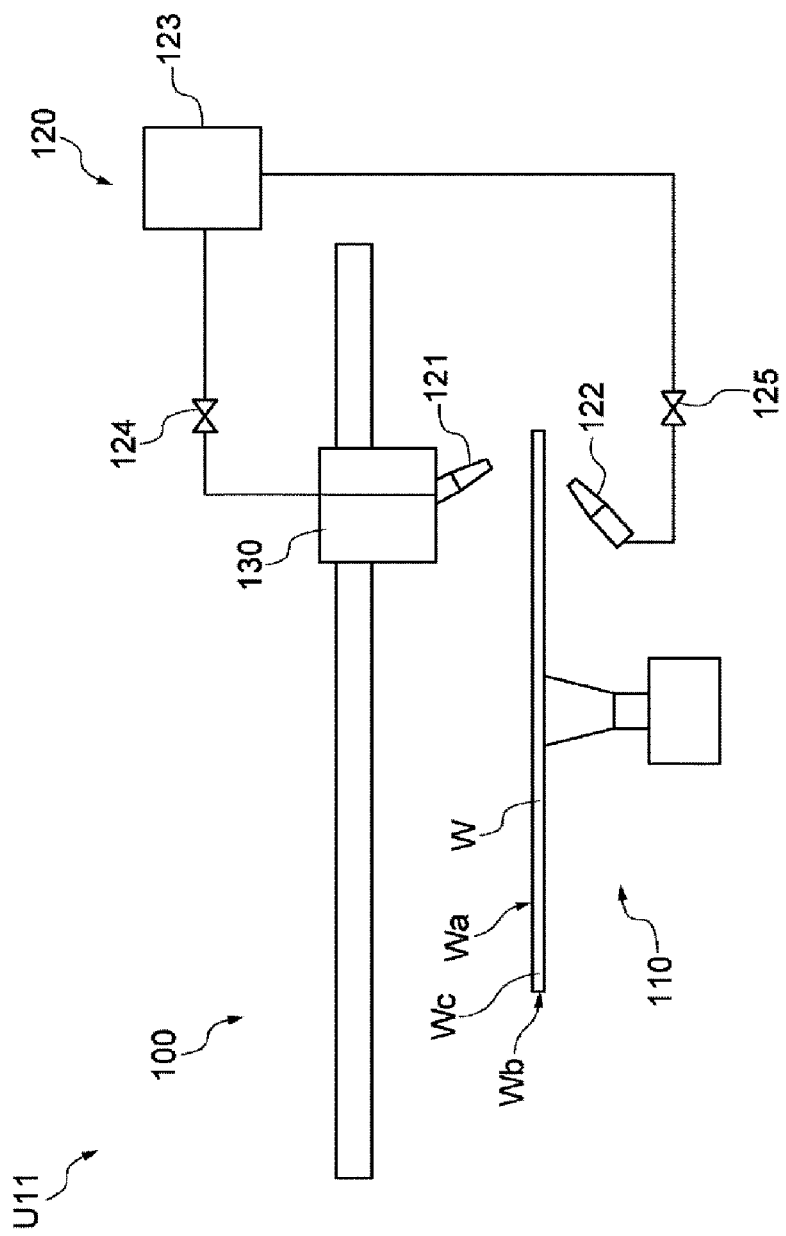
FIG. 4 is a schematic diagram showing a liquid processing unit for forming a protective film.

As shown in FIG. 4, the liquid processing unit U11 for forming a protective film includes a protection processing part 100. The protection processing part 100 is configured to form a protective film on a peripheral edge portion Wc of the wafer W. For example, the protection processing part 100 is configured to coat a chemical liquid (hereinafter referred to as "protective liquid") for forming a protective film on the peripheral edge portion Wc of the wafer W. The protective film is formed through at least the coating and heating of the protective liquid. In the following description, for the sake of convenience in description, the films available before and after heating will be referred to as "protective film." The protection processing part 100 includes a rotary holding part 110, a liquid supply part 120 and a nozzle position adjustment part 130.

The rotary holding part 110 is configured to hold the wafer W disposed in a horizontal posture by vacuum attraction or the like, and to rotate the wafer W about a vertical axis using an electric motor or the like as a power source.

The liquid supply unit 120 supplies the protective liquid to the peripheral edge portion Wc of the wafer W held by the rotary holding part 110. Specific examples of the protective liquid include a protective liquid containing an organic component to be used as a raw material such as a phenol resin, a naphthalene resin, a polystyrene resin, a benzene resin or the like. The liquid supply part 120 includes, for example, nozzles 121 and 122, a supply source 123, and valves 124 and 125.

The nozzles 121 and 122 discharge the protective liquid to the peripheral edge portion Wc of the wafer W. The nozzle 121 is disposed above the peripheral edge portion Wc of the wafer W and is opened downward. For example, the nozzle 121 may be opened obliquely downward (downward and radially outward of the wafer W). The nozzle 122 is disposed below the peripheral edge portion Wc of the wafer W and is opened upward. For example, the nozzle 122 may be opened obliquely upward (upward and radially outward of the wafer W). The supply source 123 receives the protective liquid to be supplied and forcibly feeds the protective liquid to the nozzles 121 and 122. The valves 124 and 125 open and close flow paths of the protective liquid, which extend from the supply source 123 to the nozzles 121 and 122, respectively. The valve 124 is, for example, an air-operated valve, and is provided in a pipe that connects the supply source 123 and the nozzle 121. The valve 125 is, for example, an air-operated valve, and is provided in a pipe that connects the supply source 123 and the nozzle 122.

The nozzle position adjustment part 130 has a function of adjusting the position of the nozzle 121. The nozzle position adjustment part 130 is configured to move the nozzle 121 along a line crossing over the wafer W using an electric motor or the like as a power source.

Figure 5:
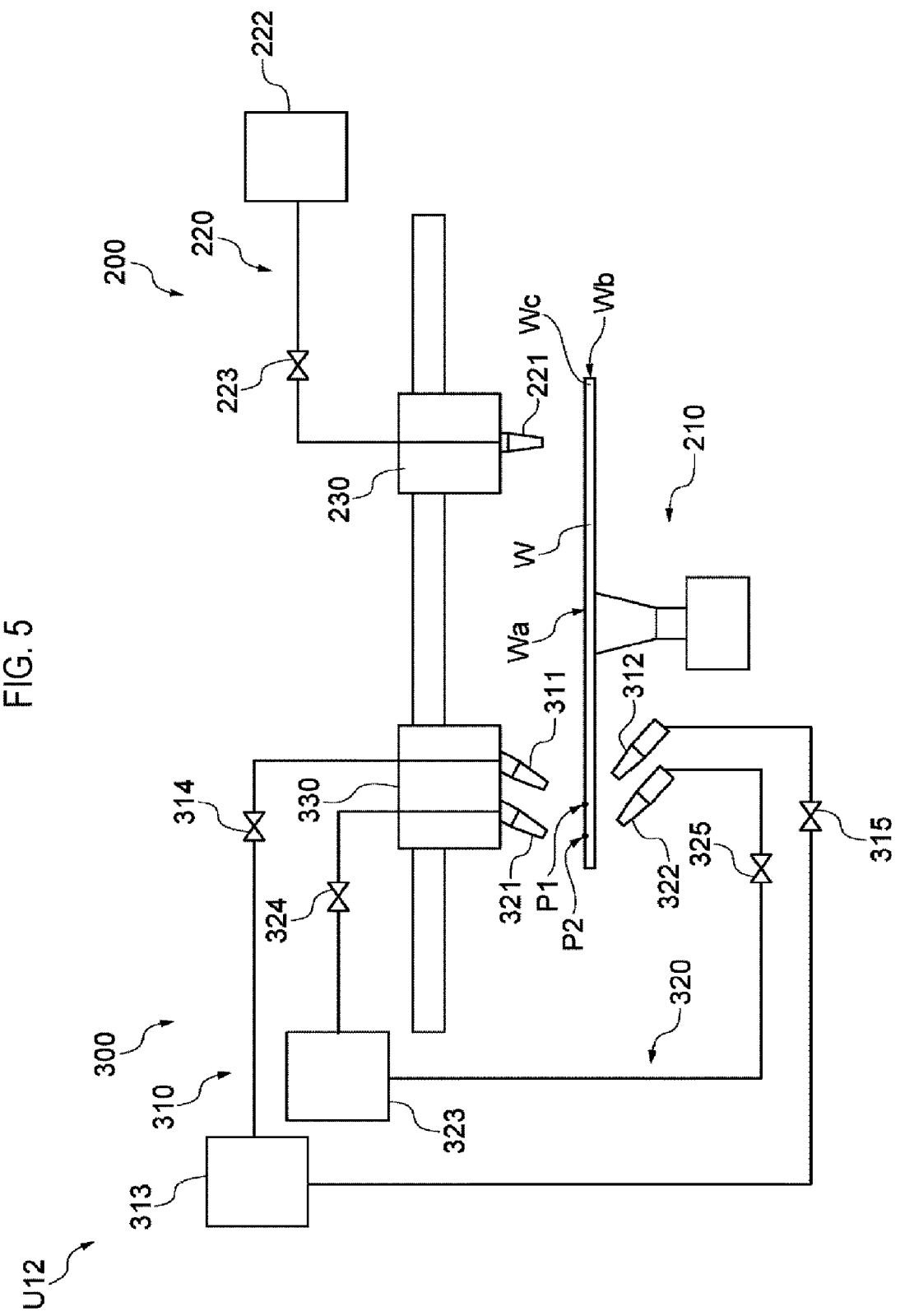
FIG. 5 is a schematic diagram showing a liquid processing unit for forming and cleaning a film.

As shown in FIG. 5, the liquid processing unit U12 for forming and cleaning a film includes a film forming part 200 and a film cleaning part 300. The film forming part 200 is configured to form a resist film (coating film) containing a metal on the front surface Wa of the wafer W. Incidentally, the resist film is formed through coating and heating of a chemical liquid as described later. In the following description, for the sake of convenience in description, the films available before and after heating will be referred to as "resist film." The film forming part 200 includes a rotary holding part 210, a liquid supply part 220 and a nozzle position adjustment part 230.

The rotary holding part 210 is configured to hold the wafer W disposed in a horizontal posture by vacuum attraction or the like and to rotate the wafer W about a vertical axis using an electric motor or the like as a power source.

The liquid supply part 220 is configured to coat a processing liquid for forming a resist film (hereinafter referred to as "resist liquid") on the front surface Wa of the wafer W held by the rotary holding part 210. The liquid supply part 220 includes, for example, a nozzle 221, a supply source 222 and a valve 223.

The nozzle 221 discharges the resist liquid onto the front surface Wa of the wafer W. The nozzle 221 is disposed above the wafer W and is opened downward (for example, vertically downward). The supply source 222 receives the resist liquid to be supplied and forcibly feeds the resist liquid to the nozzle 221. The valve 223 opens and closes a flow path of the resist liquid, which extends from the supply source 222 to the nozzle 221. The valve 223 is, for example, an air-operated valve, and is provided in a pipe that connects the supply source 222 and the nozzle 221.

The nozzle position adjustment part 230 has a function of adjusting the position of the nozzle 221. More specifically, the nozzle position adjustment part 230 is configured to move the nozzle 221 along a line crossing over the wafer W using an electric motor or the like as a power source.

The film cleaning part 300 is configured to clean the resist film on the peripheral edge portion Wc of the wafer W. The film cleaning part 300 includes liquid supply parts 310 and 320 and a nozzle position adjustment part 330.

The liquid supply part 310 is configured to supply a first chemical liquid having a function of dissolving the resist film toward the peripheral edge portion Wc of the wafer W held by the rotary holding part 210. Specific examples of the first chemical liquid include organic solvents such as propylene glycol monomethyl ether (PGME), propylene glycol monomethyl ether acetate (PGMEA) or the like. The liquid supply part 310 includes, for example, nozzles 311 and 312, a supply source 313, and valves 314 and 315.

The nozzles 311 and 312 discharge the first chemical liquid toward the peripheral edge portion Wc of the wafer W. The nozzle 311 is disposed such that the liquid supply part 310 supplies the first chemical liquid toward a position P1 (first position) of the peripheral edge portion Wc of the wafer W by discharging the first chemical liquid. The position P1 includes, for example, a position shifted by approximately 5 mm from an end face Wb of the wafer W to the central side of the wafer W. The nozzle 311 is disposed above the peripheral edge portion Wc of the wafer W and is opened downward. For example, the nozzle 311 may be opened obliquely downward (downward and radially outward of the wafer W). Hereinafter, the arrangement of the nozzle 311 for supplying the first chemical liquid to the position P1 of the peripheral edge portion Wc of the wafer W by the liquid supply part 310 through the discharge of the first chemical liquid will be referred to as "discharge arrangement A." The nozzle 312 is disposed below the peripheral edge portion Wc of the wafer W and is opened upward. For example, the nozzle 312 may be opened obliquely upward (upward and radially outward of the wafer W).

The supply source 313 accommodates the first chemical liquid to be supplied and forcibly feeds the first chemical liquid to the nozzles 311 and 312. The valves 314 and 315 open and close flow paths of the first chemical liquid, which extend from the supply source 313 to the nozzles 311 and 312, respectively. The valve 314 is, for example, an air-operated valve, and is provided in a pipe that connects the supply source 313 and the nozzle 311. The valve 315 is, for example, an air-operated valve, and is provided in a pipe that connects the supply source 313 and the nozzle 312.

The liquid supply part 320 is configured to supply a second chemical liquid having a function of dissolving the resist film toward the peripheral edge portion Wc of the wafer W held by the rotary holding part 210. Specific examples of the second chemical liquid include organic solvents such as propylene glycol monomethyl ether (PGME), propylene glycol monomethyl ether acetate (PGMEA) or the like. The second chemical liquid may be the same as or different from the first chemical liquid. The liquid supply part 320 includes, for example, nozzles 321 and 322, a supply source 323, and valves 324 and 325.

The nozzles 321 and 322 discharge the second chemical liquid toward the peripheral edge portion Wc of the wafer W. The nozzle 321 is disposed such that the liquid supply part 320 supplies the second chemical liquid to a position P2 (second position) in the peripheral edge portion Wc of the wafer W by discharging the second chemical liquid. The position P2 is defined outward of (near the periphery side) the position P1 on the peripheral edge portion Wc of the wafer W. The position P2 is a position where the discharged second chemical liquid does not reach the position P1, and may be appropriately set depending on the size of a discharge port of the nozzle 321, a flow rate of the second chemical liquid, or the like. The position P2 may include, for example, a position shifted by about 3 mm from the end surface Wb of the wafer W toward the central side of the wafer W. The nozzle 321 is disposed outward of the nozzle 311 above the peripheral edge portion Wc of the wafer W and is opened downward. For example, the nozzle 321 may be opened obliquely downward (downward and radially outward of the wafer W). Hereinafter, the arrangement of the nozzles 321 for supplying the second chemical liquid toward the position P2 of the peripheral edge portion Wc of the wafer W by the liquid supply part 320 through the discharge of the second chemical liquid will be referred to as "discharge arrangement B". The nozzle 322 is disposed below the peripheral edge portion Wc of the wafer W and is opened upward. For example, the nozzle 322 may be opened obliquely upward (upward and radially outward of the wafer W).

The supply source 323 accommodates the second chemical liquid to be supplied and forcibly feeds the second chemical liquid to the nozzles 321 and 322. The valves 324 and 325 open and close flow paths of the second chemical liquid, which extend from the supply source 323 to the nozzles 321 and 322, respectively. The valve 324 is, for example, an air-operated valve, and is provided in a pipe that connects the supply source 323 and the nozzle 321. The valve 325 is, for example, an air-operated valve, and is provided in a pipe that connects the supply source 323 and the nozzle 322.

The nozzle position adjustment part 330 has a function of adjusting the positions of the nozzles 311 and 321. The nozzle position adjustment part 330 is configured to move the nozzles 311 and 321 along a line crossing over the wafer W using an electric motor or the like as a power source.

Figure 6:
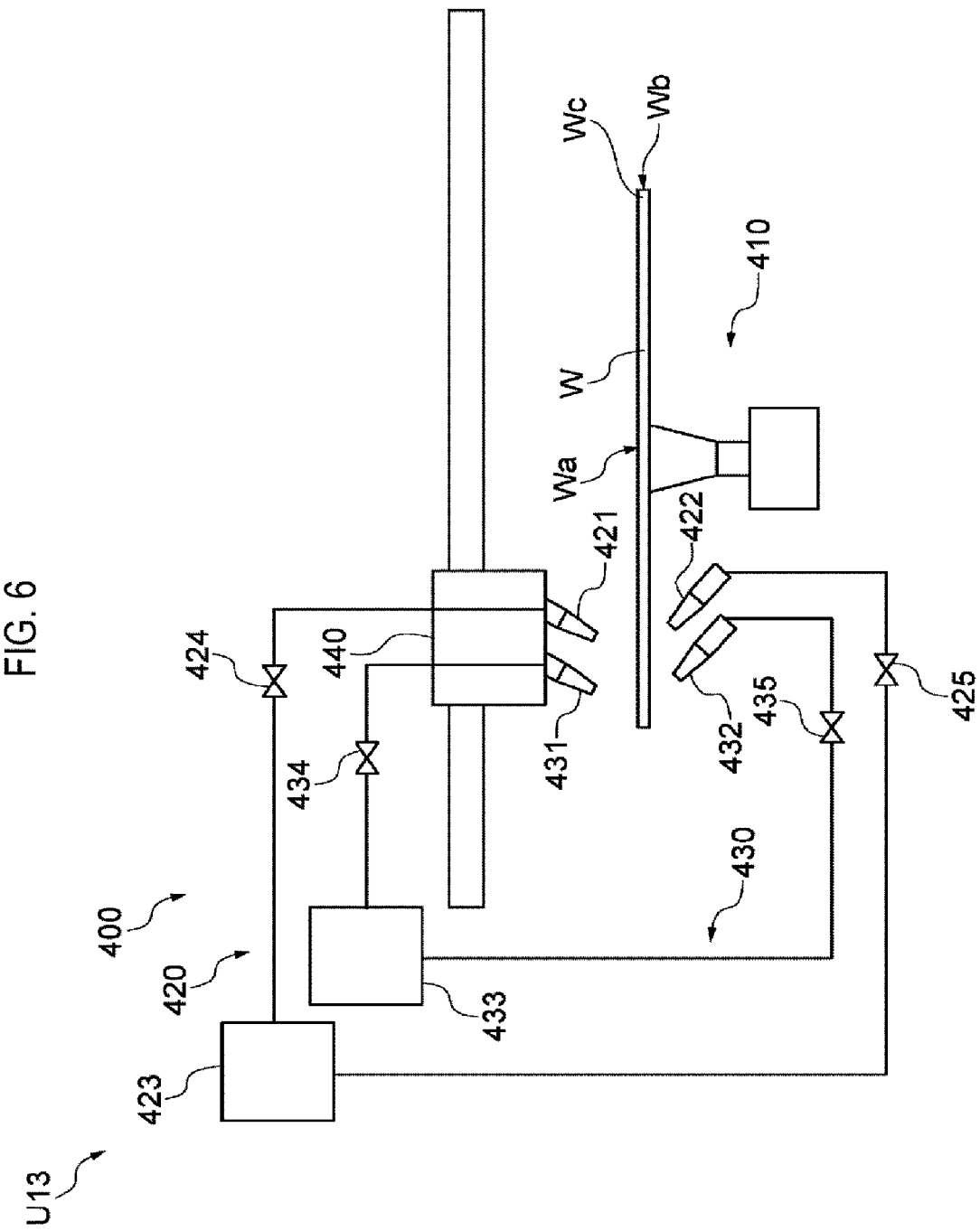
FIG. 6 is a schematic diagram showing a liquid processing unit for cleaning a protective film.

As shown in FIG. 6, the liquid processing unit U13 for cleaning a protective film includes a protective film cleaning part 400. The protective film cleaning part 400 is configured to clean the protective film on the peripheral edge portion Wc of the wafer W. The protective film cleaning part 400 includes a rotary holding part 410 and liquid supply parts 420 and 430.

The rotary holding part 410 holds the wafer W disposed in a horizontal posture by vacuum attraction or the like, and is configured to rotate the wafer W about a vertical axis using an electric motor or the like as a power source.

The liquid supply part 420 is configured to supply a third chemical liquid having a function of dissolving the protective film to the peripheral edge portion Wc of the wafer W held by the rotary holding part 410. As the third chemical liquid, a chemical liquid having high detergency with respect to metal components may be used. The third chemical liquid is, for example, a chemical liquid having a weak acidity. Specific examples of the third chemical liquid include a chemical liquid obtained by mixing an acidic component with an organic solvent. Examples of the acidic component include an inorganic acid and an organic acid. Specific examples of the acidic component include an acetic acid, a citric acid, a hydrochloric acid, a sulfuric acid and the like. The liquid supply part 420 includes, for example, nozzles 421 and 422, a supply source 423, and valves 424 and 425.

The nozzles 421 and 422 discharge the third chemical liquid toward the peripheral edge portion Wc of the wafer W. The nozzle 421 is disposed above the peripheral edge portion Wc of the wafer W and is opened downward. For example, the nozzle 421 may be opened obliquely downward (downward and radially outward of the wafer W). The nozzle 422 is disposed below the peripheral edge portion Wc of the wafer W and is opened upward. For example, the nozzle 422 may be opened obliquely upward (upward and radially outward of the wafer W). The supply source 423 accommodates the third chemical liquid to be supplied and forcibly feeds the third chemical liquid to the nozzles 421 and 422. The valves 424 and 425 open and close flow paths of the third chemical liquid, which extend from the supply source 423 to the nozzles 421 and 422, respectively. The valve 424 is, for example, an air-operated valve, and is provided in a pipe that connects the supply source 423 and the nozzle 421. The valve 425 is, for example, an air-operated valve, and is provided in a pipe that connects the supply source 423 and the nozzle 422.

The liquid supply part 430 is configured to supply a fourth chemical liquid having a function of dissolving the protective film toward the peripheral edge portion Wc of the wafer W held by the rotary holding part 410. As the fourth chemical liquid, a chemical liquid having a lower hydrogen ion concentration than the third chemical liquid may be used. In other words, a chemical liquid having a stronger acidity than the fourth chemical liquid may be used as the third chemical liquid. The third chemical liquid and the fourth chemical liquid may be compared with each other in terms of pH values measured by, for example, a pH meter. At this time, the fourth chemical liquid may be a chemical liquid whose hydrogen ion concentration is lower than that of the third chemical liquid. The fourth chemical liquid may be a chemical liquid showing acidity, a chemical liquid showing neutrality, or a chemical liquid showing alkalinity. Specific examples of the fourth chemical liquid include an organic solvent and a chemical liquid obtained by mixing an acidic component with the organic solvent. Examples of the acidic component include an inorganic acid and an organic acid. Specific examples of the acidic component include an acetic acid, a citric acid, a hydrochloric acid, a sulfuric acid and the like. Alternatively, the third chemical liquid may be a chemical liquid in which an acidic component is mixed with an organic solvent, and the fourth chemical liquid may be a chemical liquid in which an acidic component is not mixed with an organic solvent. The liquid supply part 430 includes, for example, nozzles 431 and 432, a supply source 433, and valves 434 and 435.

The nozzles 431 and 432 discharge the fourth chemical liquid toward the peripheral edge portion Wc of the wafer W. The nozzle 431 is disposed above the peripheral edge portion Wc of the wafer W and is opened downward. For example, the nozzle 431 may be opened obliquely downward (downward and radially outward of the wafer W). The nozzle 432 is disposed below the peripheral edge portion We of the wafer W and is opened upward (for example, obliquely upward toward the outer peripheral side of the wafer W). For example, the nozzle 432 may be opened obliquely upward (upward and radially outward of the wafer W). The supply source 433 accommodates the fourth chemical liquid to be supplied and forcibly feeds the fourth chemical liquid to the nozzles 431 and 432. The valves 434 and 435 open and close flow paths of the fourth chemical liquid, which extend from the supply source 433 to the nozzles 431 and 432, respectively. The valve 434 is, for example, an air-operated valve, and is provided in a pipe that connects the supply source 433 and the nozzle 431. The valve 435 is, for example, an air-operated valve, and is provided in a pipe that connects the supply source 433 and the nozzle 432.

The nozzle position adjustment part 440 has a function of adjusting positions of the nozzles 421 and 431. The nozzle position adjustment part 440 is configured to move the nozzles 421 and 431 along a line crossing over the wafer W using an electric motor or the like as a power source.

[Configuration of Controller]

Figure 7:
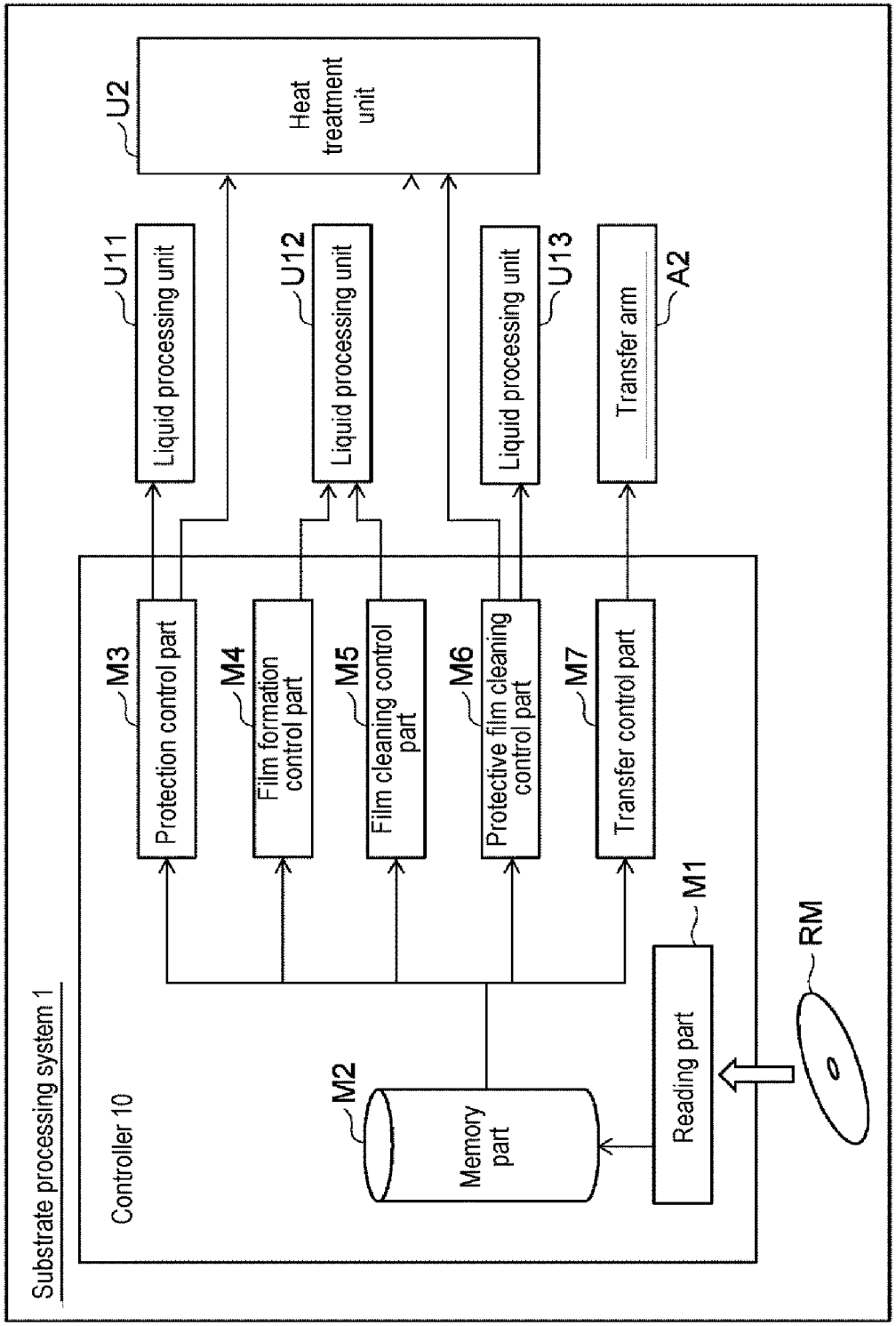
FIG. 7 is a block diagram showing a functional configuration of a controller.

As shown in FIG. 7, the controller 10 includes a reading part M1, a memory part M2, a protection control part M3, a film formation control part M4, a film cleaning control part M5, a protective film cleaning control part M6 and a transfer control part M7 as functional modules. These functional modules are merely defined by dividing the functions of the controller 10 into a plurality of modules for the sake of convenience in description and do not necessarily mean that the hardware constituting the controller 10 is divided into such modules. Each functional module is not limited to being realized by executing a program, but may be realized by a dedicated electric circuit (for example, a logic circuit) or an integrated circuit (ASIC: Application Specific Integrated Circuit) in which each functional module is integrated.

The reading part M1 reads a program from a non-transitory computer-readable recording medium RM. The recording medium RM records programs for operating each part of the substrate processing system 1. The recording medium RM may be, for example, a semiconductor memory, an optical recording disk, a magnetic recording disk, or a magneto-optical recording disk. The memory part M2 stores various kinds of data. Examples of the data stored in the memory part M2 include programs read from the recording medium RM by the reading part M1.

The protection control part M3 controls the protection processing part 100 of the liquid processing unit U11 so as to form a protective film on the peripheral edge portion Wc of the wafer W before a resist film is formed. For example, the protection control part M3 controls the protection processing part 100 so as to coat a protective liquid on the peripheral edge portion Wc of the wafer W. The protection control part M3 may further control the heat treatment unit U2 so as to heat the wafer W.

The film formation control part M4 controls the film forming part 200 so as to form the resist film on the front surface Wa of the wafer W. For example, the film formation control part M4 controls the film forming unit 200 so as to coat a resist liquid on the front surface Wa of the wafer W.

The film cleaning control part M5 controls the film cleaning part 300 of the liquid processing unit U12 so as to supply the first chemical liquid to the position P1 of the peripheral edge portion Wc of the wafer W on which the resist film is formed, and controls the film cleaning part 300 of the liquid processing unit U12 so as to supply the second chemical liquid to the position P2 of the peripheral edge portion Wc of the wafer W after the resist film dissolved by the first chemical liquid is dried. The step of controlling the film cleaning part 300 of the liquid processing unit U12 so as to supply the first chemical liquid to the position P1 includes controlling the film cleaning part 300 so that, for example, the valve 314 is opened to discharge the first chemical liquid from the nozzle 311 in a state in which the nozzle 311 is in the discharge arrangement A. The step of controlling the film cleaning part 300 of the liquid processing unit U12 so as to supply the second chemical liquid to the position P2 includes controlling the film cleaning part 300 so that, for example, the valve 324 is opened to discharge the second chemical liquid from the nozzle 321 in a state in which the nozzle 321 is in the discharge arrangement B.

After the second chemical liquid is supplied to the position P2, the protective film cleaning control part M6 controls the protective film cleaning part 400 of the liquid processing unit U13 so as to supply the third chemical liquid to the peripheral edge portion Wc of the wafer W. After the third chemical liquid is supplied to the peripheral edge portion Wc of the wafer W, the protective film cleaning control part M6 may further control the protective film cleaning part 400 of the liquid processing unit U13 so as to supply the fourth chemical liquid to the peripheral edge portion Wc of the wafer W, and may further control the heat treatment unit U2 so as to heat the wafer W.

The transfer control part M7 controls the transfer arm A2 so as to transfer the wafer W between the liquid processing unit U1 (the liquid processing units U11 to U13) and the heat treatment unit U2.

Figure 8:
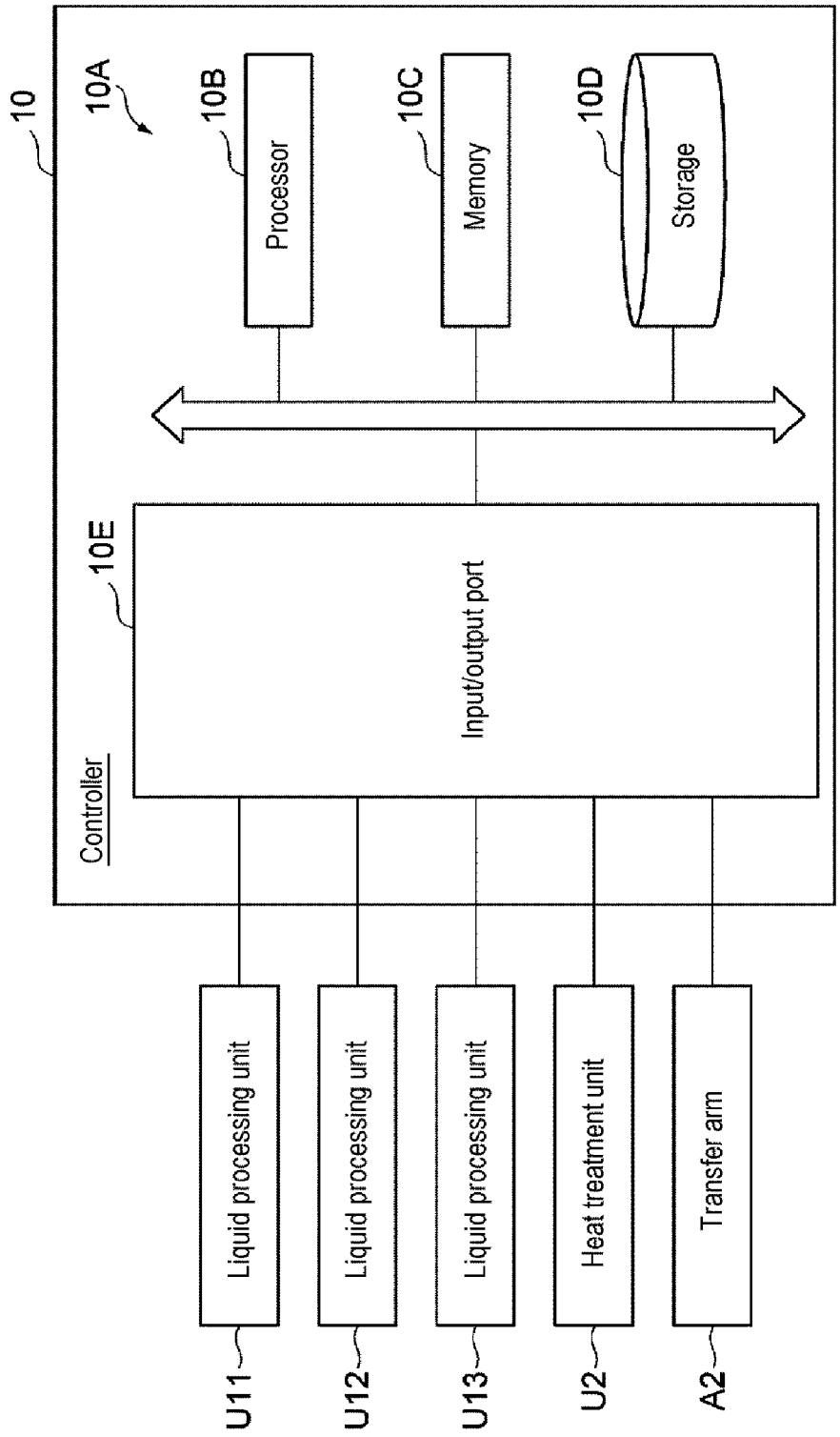
FIG. 8 is a block diagram showing a hardware configuration of a controller.

The hardware of the controller 10 is constituted by, for example, one or more control computers. The controller 10 includes, for example, a circuit 10A shown in FIG. 8 as a hardware configuration. The circuit 10A may be composed of an electric circuit element (circuitry). Specifically, the circuit 10A includes a processor 10B, a memory 10C (memory part), a storage 10D (storage part), and an input/output port 10E. The processor 10B executes a program in cooperation with at least one of the memory 10C and the storage 10D, and executes the input and output of signals via the input/output port 10E, thereby constituting each of the above-described functional modules. The input/output port 10E performs the input and output of signals between the processor 10B, the memory 10C and the storage 10D and the various devices of the substrate processing system 1.

In the present embodiment, the substrate processing system 1 includes one controller 10. However, the substrate processing system 1 may include a controller group (control part) composed of a plurality of controllers 10. In the case where the substrate processing system 1 includes the controller group, each of the above-described functional modules may be realized by one controller 10, or may be realized by a combination of two or more controllers 10. In the case where the controller 10 is composed of a plurality of computers (circuits 10A), each of the above-described functional modules may be realized by one computer (circuit 10A), or may be realized by two or more computers (circuits 10A). The controller 10 may include a plurality of processors 10B. In this case, each of the above-described functional modules may be realized by one processor 10B, or may be realized by a combination of two or more processors 10B.

[Substrate Processing Method]

Figure 9:
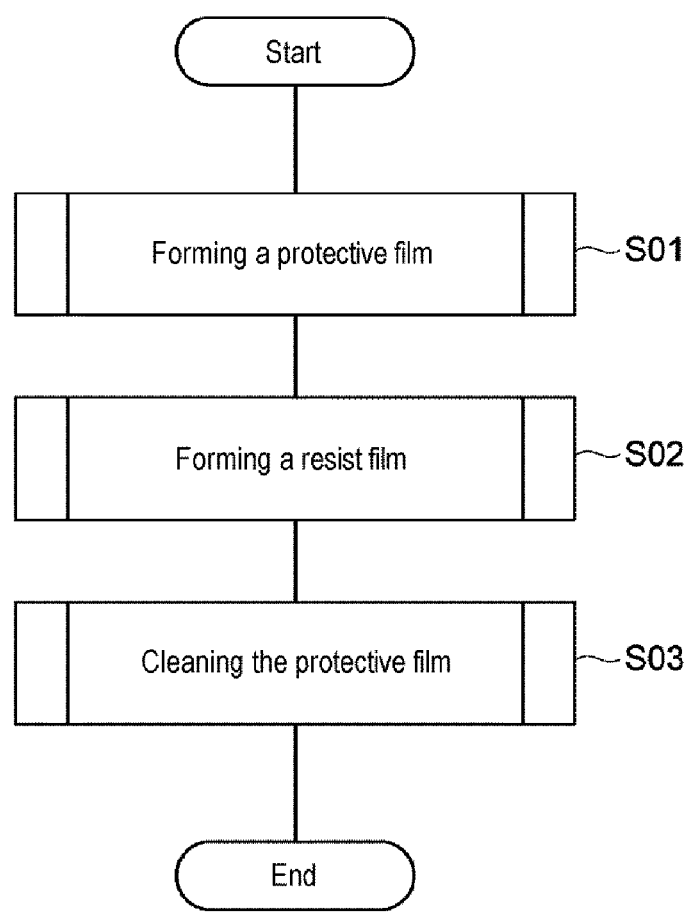
FIG. 9 is a flowchart showing a substrate processing procedure.

Referring next to FIGS. 9 to 18, a procedure of substrate processing executed by the controller 10 will be described as a substrate processing method. First, the outline of the substrate processing will be described. As shown in FIG. 9, the controller 10 first executes Step S01. Step S01 includes controlling the protection processing part 100 of the liquid processing unit U11 so as to form a protective film on the peripheral edge portion Wc of the wafer W. More specific processing contents will be described later.

Subsequently, the controller 10 executes Step S02. Step S02 includes controlling the film forming part 200 of the liquid processing unit U12 so as to form a resist film on the front surface Wa of the wafer W, controlling the film cleaning part 300 of the liquid processing unit U12 so as to supply a first chemical liquid to the position P1 of the peripheral edge portion Wc of the wafer W, and controlling the film cleaning part 300 of the liquid processing unit U12 so as to supply a second chemical liquid to the position P2 of the peripheral edge portion Wc of the wafer W after the resist film dissolved by the first chemical liquid is dried. Step S02 may further include rotating the wafer W so as to dry the resist film dissolved by the first chemical liquid, after supplying the first chemical liquid to the position P1 and before supplying the second chemical liquid to the position P2. More specific processing contents will be described later.

Subsequently, the controller 10 executes Step S03. Step S03 includes controlling the protective film cleaning part 400 of the liquid processing unit U13 so as to supply a third chemical liquid to the peripheral edge portion Wc of the wafer W. Step S03 may further include controlling the protective film cleaning part 400 of the liquid processing unit U13 so as to supply a fourth chemical liquid to the peripheral edge portion Wc of the wafer W after supplying the third chemical liquid. More specific processing contents will be described later.

[Protective Film Forming Procedure]

Figure 10:
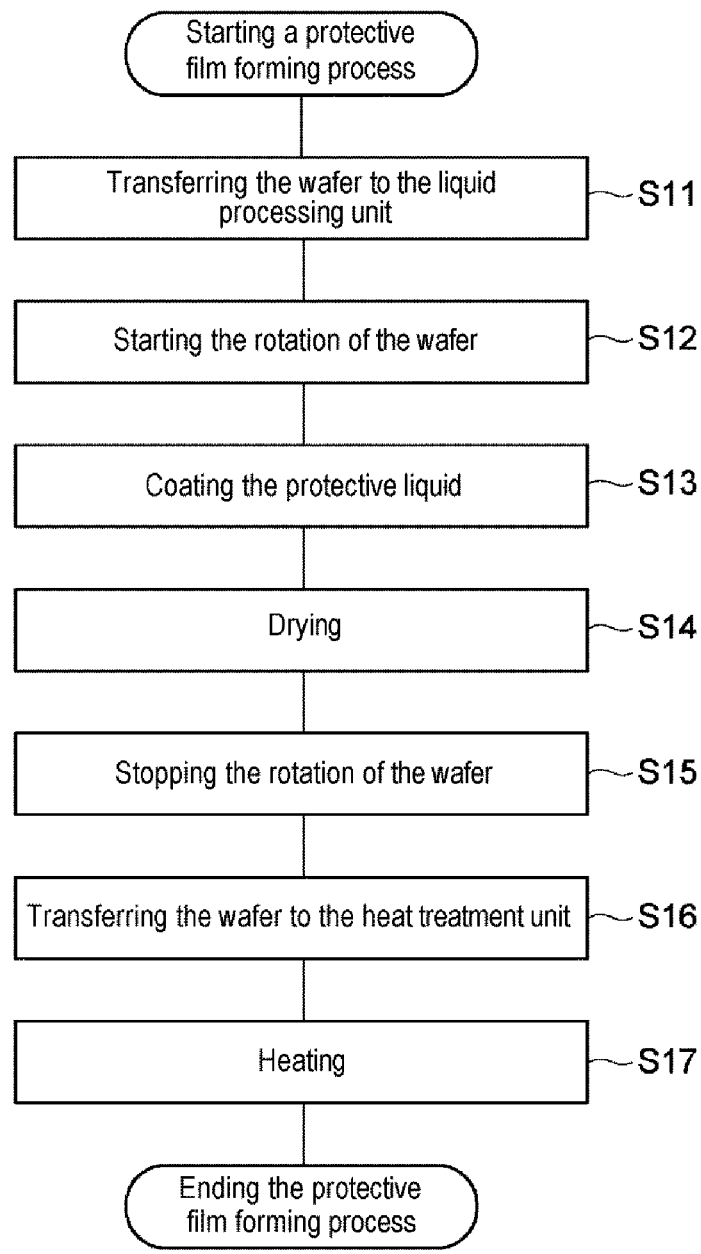
FIG. 10 is a flowchart showing a protective film forming procedure.
Figure 11:
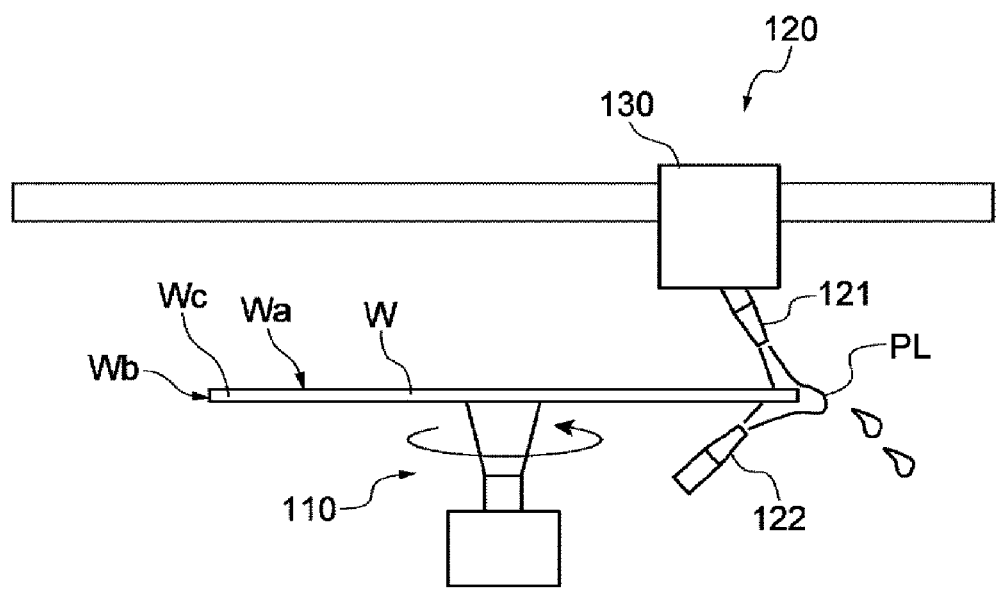
FIG. 11 is a schematic diagram showing a liquid processing unit during formation of a protective film.
Figure 12:
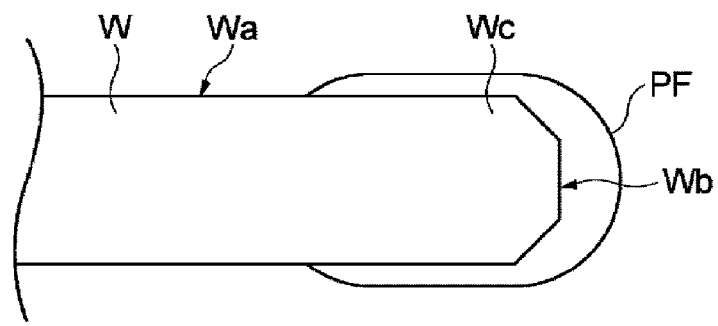
FIG. 12 is a schematic diagram showing a wafer peripheral edge portion after formation of a protective film.

Next, specific processing contents of Step S01 will be described. As shown in FIG. 10, the controller 10 first executes Step S11. In Step S11, the transfer control part M7 controls the transfer arm A2 so as to load the wafer W taken out from the carrier 11 into the liquid processing unit U11, and controls the rotary holding part 110 so as to hold the wafer W.

Subsequently, the controller 10 executes Step S12. In Step S12, the protection control part M3 controls the rotary holding part 110 so as to start the rotation of the wafer W.

Subsequently, the controller 10 executes Step S13. In Step S13, the protection control part M3 controls the nozzle position adjustment part 130 so as to dispose the nozzle 121 above the peripheral edge portion Wc of the wafer W held by the rotary holding part 110. Thereafter, the protection control part M3 controls the liquid supply part 120 so as to open the valves 124 and 125 and start discharging of a protective liquid PL from the nozzles 121 and 122 (see FIG. 11). As a result, the protective liquid PL is supplied to the peripheral edge portion Wc of the rotating wafer W from above and below so that a liquid film of the protective liquid PL is formed on the peripheral edge portion Wc. Thereafter, the protection control unit M3 controls the liquid supply part 120 so as to close the valves 124 and 125 to stop the discharging of the protective liquid PL from the nozzles 121 and 122.

Subsequently, the controller 10 executes Step S14. In Step S14, the protection control part M3 causes the rotary holding part 110 to continuously rotate the wafer W so as to dry the protective liquid PL on the peripheral edge portion Wc (so as to volatilize a solvent). As a result, a protective film PF is formed on the peripheral edge portion Wc of the wafer W (see FIG. 12).

Subsequently, the controller 10 executes Step S15. In Step S15, the protection control part M3 controls the rotary holding part 110 so as to stop the rotation of the wafer W.

Subsequently, the controller 10 executes Step S16. In Step S16, the transfer control part M7 controls the transfer arm A2 so as to take out the wafer W from the liquid processing unit U11 and load the wafer W into the heat treatment unit U2.

Subsequently, the controller 10 executes Step S17. In Step S17, the protection control part M3 controls the heat treatment unit U2 so as to heat the wafer W. As the wafer W is heated, the protective film PF formed on the peripheral edge portion Wc of the wafer W is heated. This facilitates the crosslinking reaction or the like in the protective film PF, thus improving the strength of the protective film PF. In this manner, the controller 10 completes the control for forming the protective film.

[Resist Film Forming Procedure]

Figure 13:
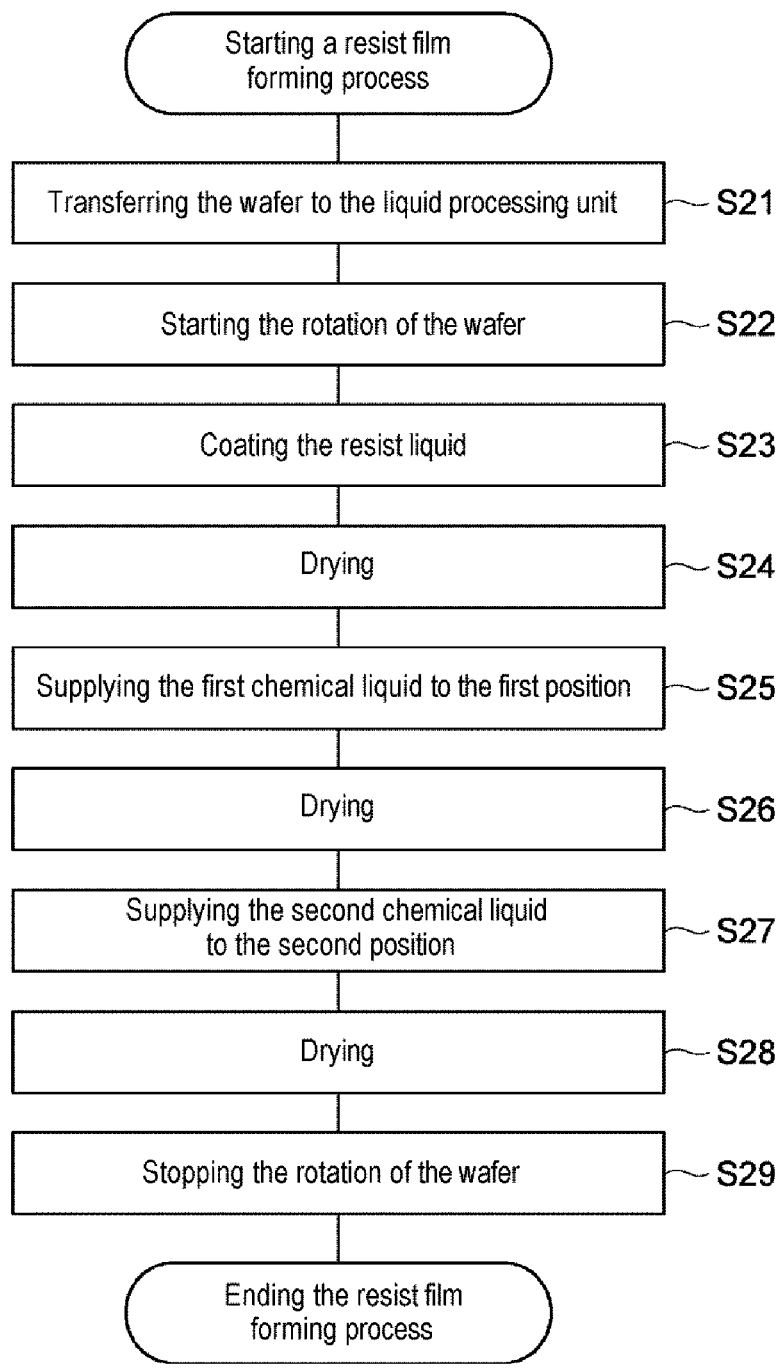
FIG. 13 is a flowchart showing a resist film forming procedure.
Figure 14A:
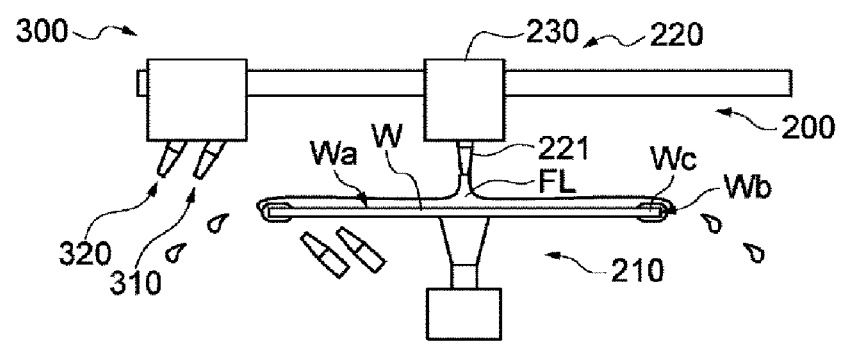
FIGS. 14A to 14D are schematic diagrams showing a liquid processing unit during formation of a resist film.
Figure 14B:
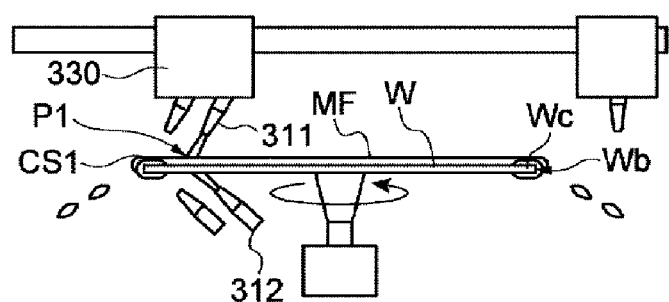
Figure 14C:
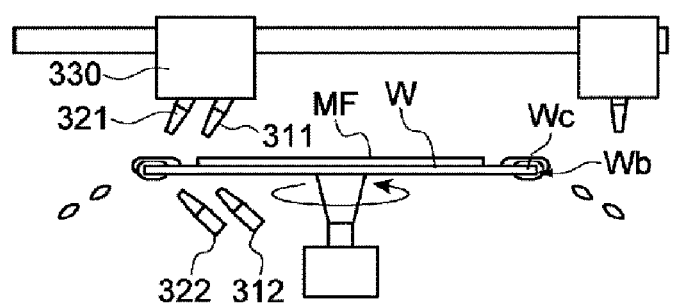
Figure 14D:
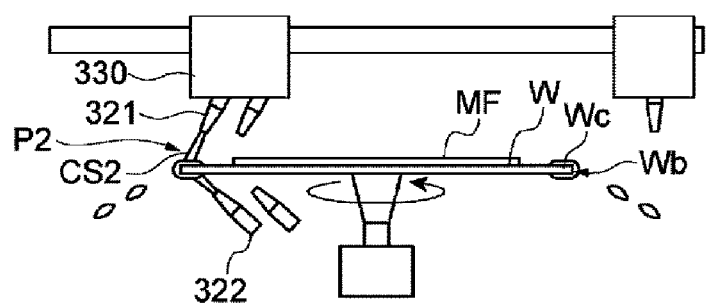

Next, specific process contents of Step S02 will be described. As shown in FIG. 13, the controller 10 first executes Step S21. In Step S21, the transfer control part M7 controls the transfer arm A2 so as to take out the wafer W from the heat treatment unit U2 and load the wafer W into the liquid processing unit U12, and controls the rotary holding part 210 so as to hold the wafer W.

Subsequently, the controller 10 executes Step S22. In Step S22, the protection control part M3 controls the rotary holding part 210 so as to start the rotation of the wafer W.

Subsequently, the controller 10 executes Step S23. In Step S23, the film formation control part M4 controls the nozzle position adjustment part 230 so as to dispose the nozzle 221 above the rotational center of the wafer W held by the rotary holding part 210. Thereafter, the film formation control part M4 controls the liquid supply part 220 so as to open the valve 223 and start the discharging of a resist liquid FL from the nozzle 221 (see FIG. 14A). As a result, the resist liquid FL is coated on the front surface Wa of the rotating wafer W, whereby a liquid film of the resist liquid FL is formed. Thereafter, the film formation control part M4 controls the liquid supply part 220 so as to close the valve 223 and stop the discharging of the resist liquid FL from the nozzle 221.

Subsequently, the controller 10 executes Step S24. In Step S24, the film formation control part M4 causes the rotary holding part 210 to continuously rotate the wafer W so as to dry the resist liquid FL coated on the front surface Wa (so as to volatilize a solvent). As a result, a resist film MF is formed on the front surface Wa of the wafer W (see FIG. 15A).

Subsequently, the controller 10 executes Step S25. In Step S25, the film cleaning control part M5 controls the nozzle position adjustment part 330 so as to dispose the nozzle 311 in the discharge arrangement A (the arrangement in which the liquid supply part 310 supplies the first chemical liquid to the position P1 of the peripheral edge portion Wc of the wafer W by discharging the first chemical liquid). Thereafter, the film cleaning control part M5 controls the liquid supply part 310 so as to open the valves 314 and 315 and start the discharging of the first chemical liquid CS1 from the nozzles 311 and 312 (see FIG. 14B). As a result, the first chemical liquid CS1 is supplied to the peripheral edge portion Wc of the rotating wafer W from above and below. At this time, since the nozzle 311 is in the state of the discharge arrangement A, the first chemical liquid CS1 is supplied to the position P1 where the resist film MF is dissolved. When the resist film MF is dissolved by the first chemical liquid CS1, a metal component M may elute from the dissolved portion of the resist film MF (see FIG. 15B). Thereafter, the film cleaning control part M5 controls the liquid supply part 310 so as to close the valves 314 and 315 and stop the discharging of the first chemical liquid CS1 from the nozzles 311 and 312.

Subsequently, the controller 10 executes Step S26. In Step S26, the film formation control part M4 causes the rotary holding part 210 to continuously rotate the wafer W so as to dry the resist film MF formed on the front surface Wa of the wafer W and dissolved by the first chemical liquid CS1 (see FIG. 14C). A rotation speed at which the rotary holding part 210 rotates the wafer W may be, for example, 1,000 rpm or more and 3,500 rpm or less, specifically 1,500 rpm or more and 3,000 rpm or less, more specifically 2,000 rpm or more and 2,500 rpm or less, ultimately 2,000 rpm. A time period during which the rotary holding part 210 rotates the wafer W may be, for example, 3 seconds or more and 10 seconds or less, specifically 4 seconds or more and 8 seconds or less, more specifically 5 seconds or more and 7 seconds or less, more preferably 5 seconds. As the resist film MF dissolved by the first chemical liquid CS1 is dried, the resist film MF remaining outward of the position P1 on the front surface Wa of the wafer W is separated from the resist film MF present on the central side of the wafer W.

Subsequently, the controller 10 executes Step S27. In Step S27, the film cleaning control part M5 controls the nozzle position adjustment part 330 so as to dispose the nozzle 321 in the discharge arrangement B (the arrangement in which the liquid supply part 320 supplies the second chemical liquid to the position P2 of the peripheral edge portion Wc of the wafer W by discharging the second chemical liquid). Thereafter, the film cleaning control part M5 controls the liquid supply part 320 so as to open the valves 324 and 325 and start the discharging of the second chemical liquid CS2 from the nozzles 321 and 322 (see FIG. 14D). As a result, the second chemical liquid CS2 is supplied to the peripheral edge portion Wc of the rotating wafer W from above and below. At this time, since the nozzle 321 is in the state of the discharge arrangement B, the second chemical liquid CS2 is supplied to the position P2 where the resist film MF is dissolved. Even when the resist film MF is dissolved by the second chemical liquid CS2, as in the case of the first chemical liquid CS1, a metal component M may elute from the dissolved portion of the resist film MF (see FIG. 15C).

On the other hand, before Step S27 is executed, the resist film MF dissolved by the first chemical liquid CS1 has already been dried. Therefore, when the second chemical liquid CS2 is supplied to the position P2 defined outward (the peripheral edge side) of the position P1, the second chemical liquid CS2 is less likely to be supplied to the resist film MF on the central side of the wafer W. Accordingly, the dissolution of the resist film MF is suppressed on the central side of the wafer W. This avoids the possibility that the resist film MF on the central side of the wafer W is dissolved to become an elution source of the metal component M (see FIG. 15C). Thereafter, the film cleaning control part M5 controls the liquid supply part 320 so as to close the valves 324 and 325 and stop the discharging of the second chemical liquid CS2 from the nozzles 321 and 322.

Subsequently, the controller 10 executes Step S28. In Step S28, the film formation control part M4 causes the rotary holding part 210 to continuously rotate the wafer W so as to dry the resist film MF dissolved by the second chemical liquid CS2 (so as to dry the resist liquid FL on the front surface Wa of the wafer W (so as to volatilize a solvent)).

Subsequently, the controller 10 executes Step S29. In Step S29, the film formation control part M4 controls the rotary holding part 210 so as to stop the rotation of the wafer W.

In this manner, the controller 10 completes the control for forming the resist film.

[Protective Film Cleaning Procedure]

Figure 16:
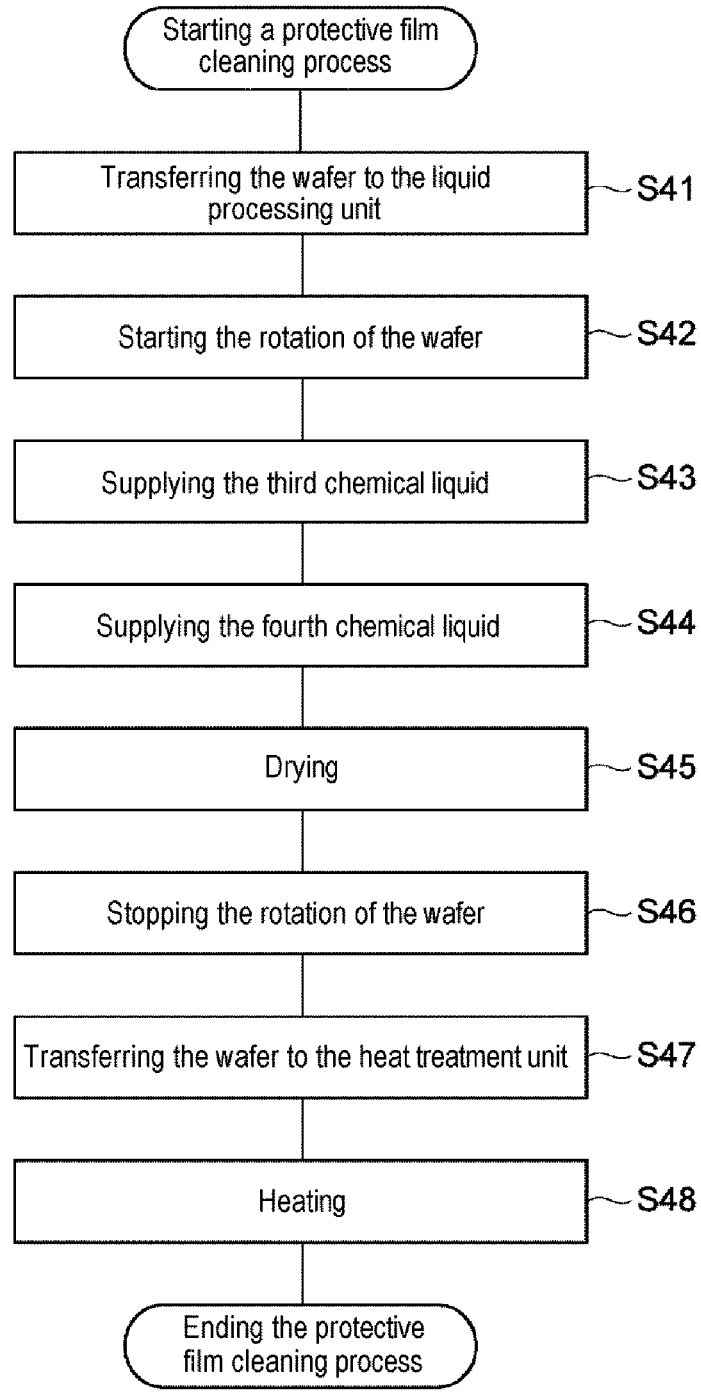
FIG. 16 is a flowchart showing a protective film cleaning procedure.
Figure 17A:
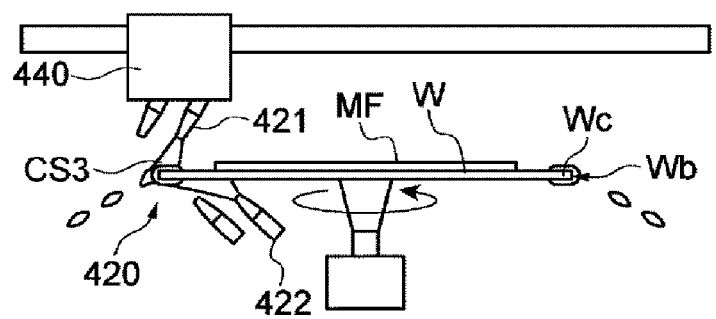
FIGS. 17A and 17B are schematic diagrams showing a liquid processing unit during cleaning of a protective film.
Figure 17B:
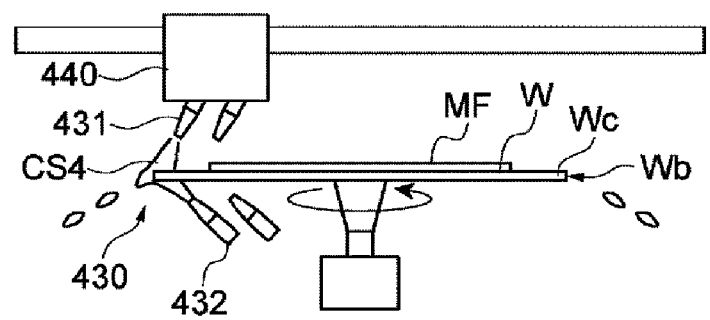
Figure 18A:
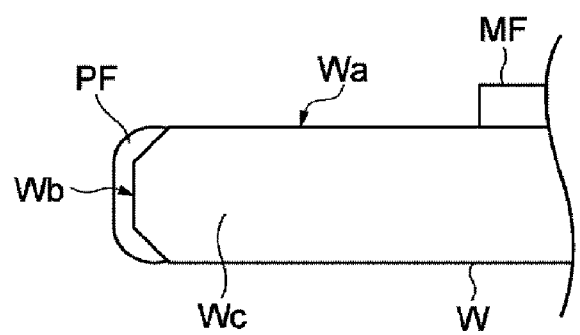
FIGS. 18A and 18B are schematic diagrams showing a wafer peripheral edge portion after cleaning of a protective film.
Figure 18B:
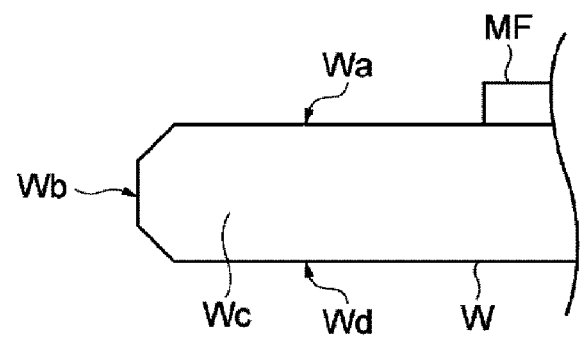

Next, specific processing contents of Step S03 will be described. As shown in FIG. 16, the controller 10 first executes Step S41. In Step S41, the transfer control part M7 controls the transfer arm A2 so as to take out the wafer W from the liquid processing unit U12 and load the wafer W into the liquid processing unit U13, and controls the rotary holding part 410 so as to hold the wafer W.

Subsequently, the controller 10 executes Step S42. In Step S42, the protective film cleaning control part M6 controls the rotary holding part 410 so as to start the rotation of the wafer W.

Subsequently, the controller 10 executes Step S43. In Step S43, the protective film cleaning control part M6 controls the nozzle position adjustment part 440 so as to dispose the nozzle 421 above the rotational center of the wafer W held by the rotary holding part 410. Thereafter, the protective film cleaning control part M6 controls the liquid supply part 420 so as to open the valves 424 and 425 and start the discharging of the third chemical liquid CS3 from the nozzles 421 and 422 (see FIG. 17A). As a result, the third chemical liquid CS3 is supplied to the peripheral edge portion Wc of the rotating wafer W from above and below such that the protective film PF is dissolved. Thereafter, the film formation control part M4 controls the liquid supply part 420 so as to close the valves 424 and 425 and stop the discharging of the third chemical liquid CS3 from the nozzles 421 and 422.

Figure 15A:
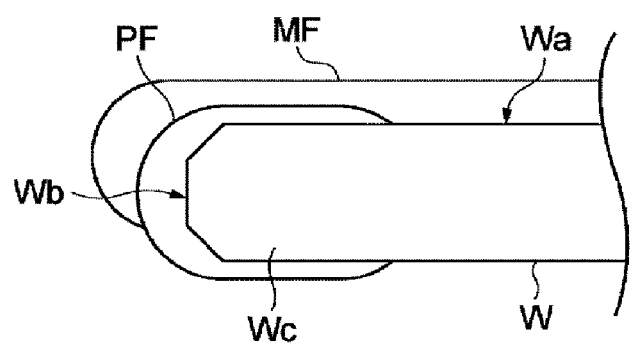
FIGS. 15A to 15D are schematic diagrams showing a wafer peripheral edge portion during formation of a resist film.
Figure 15B:
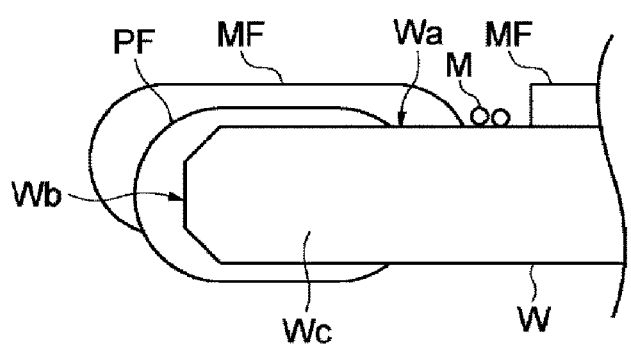
Figure 15C:
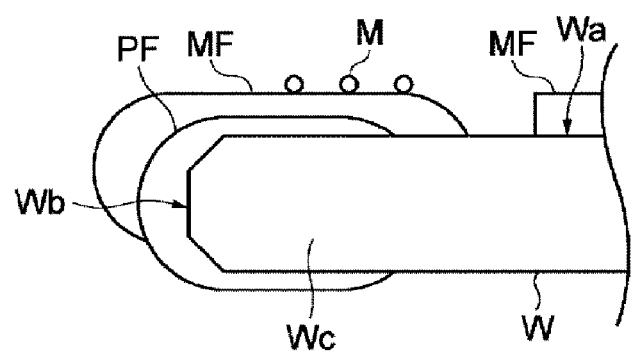
Figure 15D:
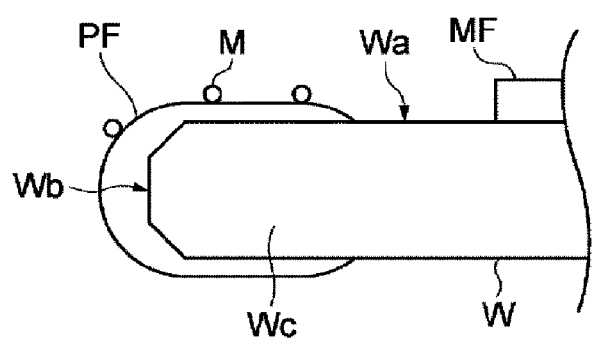

Meanwhile, even when the resist film MF is removed after the discharging of the second chemical liquid CS2 is stopped in Step S27, a metal component M may remain in the protective film PF (see FIG. 15D). In a surface of the protective film PF, there may be formed an intermixing layer in which the component of the protective film PF and the metal component M are bonded to each other. In Step S43, the third chemical liquid CS3 is supplied to the peripheral edge portion Wc of the rotating wafer W from above and below, whereby the metal component M adhering to the protective film PF is also removed.

Subsequently, the controller 10 executes Step S44. In Step S44, the protective film cleaning control part M6 controls the nozzle position adjustment part 440 so as to dispose the nozzle 431 above the rotational center of the wafer W held by the rotary holding part 410. Thereafter, the protective film cleaning control part M6 controls the liquid supply part 430 so as to open the valves 424 and 425 and start the discharging of the fourth chemical liquid CS4 from the nozzles 421 and 422 (see FIG. 17B). As a result, the fourth chemical liquid CS4 is supplied to the peripheral edge portion Wc of the rotating wafer W from above and below such that the protective film PF is dissolved. Thereafter, the protective film cleaning control part M6 controls the liquid supply part 420 so as to close the valves 424 and 425 and stop the discharging of the fourth chemical liquid CS4 from the nozzles 421 and 422. Consequently, even when the protective film PF remains on the end surface Wb of the wafer W (see FIG. 18A), the protective film PF is also sufficiently removed (see FIG. 18B).

Subsequently, the controller 10 executes Step S45. In Step S45, the protective film cleaning control part M6 causes the rotary holding part 410 to continuously rotate the wafer W so as to dry the third chemical liquid CS3 and the fourth chemical liquid CS4 in the peripheral edge portion Wc (so as to volatilize a solvent).

Subsequently, the controller 10 executes Step S46. In Step S46, the protective film cleaning control part M6 controls the rotary holding part 410 so as to stop the rotation of the wafer W.

Subsequently, the controller 10 executes Step S47. In Step S47, the transfer control part M7 controls the transfer arm A2 so as to take out the wafer W from the liquid processing unit U13 and load the wafer W into the heat treatment unit U2.

Subsequently, the controller 10 executes Step S48. In Step S48, the protective film cleaning control part M6 controls the heat treatment unit U2 so as to heat the wafer W. As the wafer W is heated, the resist film MF formed on the peripheral edge portion Wc of the wafer W is heated. This facilitates the crosslinking reaction or the like in the resist film MF, thus improving the strength of the resist film MF. Thereafter, the transfer control part M7 controls the transfer arm A2 so as to take out the wafer W from the heat treatment unit U2. In this manner, the controller 10 completes the control for cleaning the protective film.

[Actions]

In the present embodiments as described above, after the first chemical liquid CS1 is supplied to the position P1 and the resist film MF on the peripheral edge portion Wc of the wafer W is cleaned, the second chemical liquid CS2 is supplied to the position P2 to clean the resist film MF present outward of the position P1 in the peripheral edge portion Wc of the wafer W. Before the second chemical liquid CS2 is supplied, the resist film MF dissolved by the first chemical liquid CS1 has already been dried. Therefore, the resist film MF present outward of the position P1 is separated from the resist film MF present on the central side of the wafer W. For that reason, the supply of the second chemical liquid CS2 to the position P2 defined outward of the position P1 makes it difficult for the second chemical liquid CS2 to be supplied to the resist film MF on the central side of the wafer W. This avoids the possibility that the resist film MF on the central side of the wafer W is dissolved by the second chemical liquid CS2 to become an elution source of the metal component M. In other words, if the second chemical liquid CS2 is supplied and the resist film MF on the peripheral edge portion Wc of the wafer W is cleaned, it is possible to remove most of the metal component M remaining at the peripheral edge portion Wc of the wafer W after supplying the first chemical liquid CS1, in a state in which the additional elution of the metal component M is suppressed. In this way, it is possible to suppress metal contamination attributable to the use of a metal-containing film.

In the present embodiment, after supplying the first chemical liquid CS1 to the position P1 and before supplying the second chemical liquid CS2 to the position P2, the controller 10 may further execute the rotation of the wafer W so as to dry the resist film MF dissolved by the first chemical liquid CS1. In this case, airflow is generated around the resist film MF as the wafer W rotates. This facilitates the drying of the resist film MF. In addition, it is unnecessary to use another device (such as a blower or a heater) for drying the resist film MF. This makes it possible to simplify the apparatus.

In the present embodiment, the liquid processing unit may further include the protection processing part 100 configured to form the protective film PF on the peripheral edge portion Wc of the wafer W, and the protective film cleaning part 400 configured to clean the protective film PF on the peripheral edge portion Wc of the wafer W. In some embodiments, the controller 10 may further control the protection processing part 100 so as to form the protective film PF on the peripheral edge portion Wc of the wafer W before the resist film MF is formed on the front surface Wa of the wafer W, and may further control the protective film cleaning part 400 so as to supply the third chemical liquid CS3 having the function of dissolving the protective film PF to the peripheral edge portion Wc of the wafer W after the second chemical liquid CS2 is supplied to the second position P2.

In order to improve the removal performance of the metal component M, for example, it is conceivable that a chemical liquid having high detergency with respect to the metal component M is used as the first chemical liquid CS1 and the second chemical liquid CS2. Meanwhile, there is a risk that the wafer W is eroded by being exposed to the chemical liquid having high detergency with respect to the metal component M. In contrast, according to the present embodiment, the protective film PF is formed prior to the supply of the first chemical liquid CS1, and the second chemical liquid CS2 is supplied prior to the supply of the third chemical liquid CS3 having the function of dissolving the protective film PF. Therefore, at the time of supplying the first chemical liquid CS1 and at the time of supplying the second chemical liquid CS2, the peripheral edge portion Wc of the wafer W is protected by the protective film PF. Accordingly, even in the case where a chemical liquid having high detergency with respect to the metal component M is used as the first chemical liquid CS1 and the second chemical liquid CS2, it is possible to suppress erosion of the wafer W by the first chemical liquid CS1 and the second chemical liquid CS2. Furthermore, the protective film PF is formed prior to the formation of the resist film MF, and the second chemical liquid CS2 is supplied prior to the supply of the third chemical liquid CS3, whereby it is possible to greatly reduce the metal component M remaining on the peripheral edge portion Wc of the wafer W after the protective film PF is removed.

In the present embodiment, the controller 10 may further control the protective film cleaning part 400 so that, after the third chemical liquid CS3 is supplied to the peripheral edge portion Wc of the wafer W, the fourth chemical liquid CS4 used for removing the protective film PF and having a lower hydrogen ion concentration than that of the third chemical liquid CS3 is supplied to the peripheral edge portion Wc of the wafer W. A chemical liquid having a strong acidity (namely, a chemical liquid having a relatively high hydrogen ion concentration) is also expected to have high detergency with respect to the metal component M. On the other hand, the chemical liquid having a strong acidity may have low removal performance for the protective film PF. Therefore, as in the present embodiment, by using the chemical liquid having a lower hydrogen ion concentration than the third chemical liquid CS3 as the fourth chemical liquid CS4

(namely, by using the chemical liquid having a stronger acidity than the fourth chemical liquid CS4 as the third chemical liquid CS3), it is possible to sufficiently remove the protective film PF with the fourth chemical liquid CS4 having a relatively weak acidity, while sufficiently removing the metal component M with the third chemical liquid CS3 having a relatively strong acidity.

[Modifications]

It should be noted that the embodiments and modifications disclosed herein are exemplary in all respects and are not restrictive. The above-described embodiments may be omitted, replaced or modified in various forms without departing from the scope and spirit of the appended claims.

For example, the liquid processing unit U1 is also applicable to a liquid processing unit U1 of a module for forming a film other than the resist film MF containing a metal. Specific examples of the film other than the metal-containing resist film MF include a metal-containing hard mask (metal hard mask) and the like. In this case, the liquid processing unit U1 may be the liquid processing unit U1 of the module 15.

In some embodiments, the liquid processing unit U12 for forming and cleaning a film may be provided with a blower. The controller 10 may control the liquid processing unit U12 so that a gas (for example, an air or a nitrogen gas) is blown onto the front surface Wa of the wafer W by the blower in Step S26, thereby drying the resist film MF dissolved by the first chemical liquid CS1. Alternatively, the liquid processing unit U12 for forming and cleaning a film may be provided with a heat source. The controller 10 may control the liquid processing unit U12 so that the front surface Wa of the wafer W is heated by the heat source in Step S26, thereby drying the resist film MF dissolved by the first chemical liquid CS1.

When the same chemical liquid is used as the first chemical liquid CS1 and the second chemical liquid CS2, the film cleaning part 300 may not include any one of the liquid supply parts 310 and 320. At this time, the liquid supply part 310 or the liquid supply part 320 may supply the first chemical liquid CS1 and the second chemical liquid CS2 to the position P1 and the position P2 depending on the position of the nozzle 311 or the nozzle 321 adjusted by the nozzle position adjustment part 330.

The liquid supply part 310 may not include the nozzle 312 and the valve 315. The liquid supply part 320 may not include the nozzle 322 and the valve 325.

The liquid supply part 430 may not include any one of the nozzles 431 and 432. When the liquid supply part 430 does not include the nozzle 431, the liquid supply part 430 may not include the valve 434. When the liquid supply part 430 does not include the nozzle 432, the liquid supply part 430 may not include the valve 435.

In the protective film cleaning process (Step S03), the controller 10 may execute the processes of Steps S47 and S48 not after Step S46 but before Step S41. In other words, the resist film MF may be heated before the protective film PF is cleaned.

EMBODIMENTS

Incidentally, the metal-containing film can be utilized in various situations during substrate processing. For example, improvement in sensitivity to exposure processing is expected by using the metal-containing film as a resist film. Furthermore, improvement in etching resistance is expected by using the metal-containing film as a so-called hard mask. However, when utilizing the metal-containing film, it is necessary to suppress metal contamination of the substrate itself and the equipment kept in contact with the substrate.

For the purpose of suppressing metal contamination, it is conceivable to supply a chemical liquid (for example, a chemical liquid having a function of dissolving a film) for removing a film to a peripheral edge portion of a substrate which may be contacted by a device to hold the substrate. However, as a result of earnest research conducted by the present inventors, it was newly found that if the chemical liquid having a function of dissolving a film is merely supplied to the peripheral edge portion of the substrate, a metal component may be eluted from the film dissolved by the chemical liquid even after the chemical liquid is supplied, and most of the eluted metal component may remain on the peripheral edge portion of the substrate. Therefore, in the following description, there will be exemplified a substrate processing apparatus, a substrate processing method and a non-transitory computer-readable recording medium capable of suppressing metal contamination attributable to the use of a metal-containing film. In the following description, parts having functions and configurations which are substantially same as those in the aforementioned embodiments will be designated by like reference numerals for the sake of convenience in description.

Embodiment 1

A substrate processing apparatus 1 according to one embodiment of the present disclosure includes a film forming part 200 configured to form a metal-containing film MF on a front surface Wa of a substrate W, a film cleaning part 300 configured to clean the metal-containing film MF present on a peripheral edge portion Wc of the substrate W, and a control part 10. The control part 10 executes: controlling the film forming part 200 so as to form the metal-containing film MF on the front surface Wa of the substrate W; controlling the film cleaning part 300 so as to supply a first chemical liquid CS1 having a function of dissolving the film MF to a first position P1 of the peripheral edge portion Wc of the substrate W; and controlling the film cleaning part 300 so as to supply a second chemical liquid CS2 having a function of dissolving the metal-containing film MF to a second position P2 in the peripheral edge portion Wc of the substrate W, which is closer to a periphery of the substrate W than the first position P1, after the metal-containing film MF dissolved by the first chemical liquid CS1 is dried.

According to the substrate processing apparatus 1, after the first chemical liquid CS1 is supplied to the first position P1 and the metal-containing film MF on the peripheral edge portion Wc of the substrate W is cleaned, the second chemical liquid CS2 is supplied to the second position P2 such that the metal-containing film MF present outward of the first position P1 on the peripheral edge portion Wc of the substrate W is cleaned. Since the metal-containing film MF dissolved by the first chemical liquid CS1 has already been dried before the supply of the second chemical liquid CS2, the metal-containing film MF present outward of the first position P1 is separated from the metal-containing film MF present on the central side of the substrate W. Therefore, by supplying the second chemical liquid CS2 to the second position P2 being closer to a periphery of the substrate than the first position P1, it becomes difficult for the second chemical liquid CS2 to be supplied to the metal-containing film MF present on the central side of the substrate W. This avoids the possibility that the metal-containing film MF present on the central side of the substrate W is dissolved by the second chemical liquid CS2 to become an elution source of a metal component M. In other words, if the metal-containing film MF present on the peripheral edge portion Wc of the substrate W is cleaned by supplying the second chemical liquid CS2, it is possible to remove most of the metal component M remaining on the peripheral edge portion Wc of the substrate W after the supply of the first chemical liquid CS1, in a state in which additional elution of the metal component M is suppressed. In this way, it is possible to suppress metal contamination attributable to the use of the metal-containing film.

Embodiment 2

In the apparatus 1 according to Embodiment 1, the control part 10 may further execute rotating the substrate W so as to dry the metal-containing film MF dissolved by the first chemical liquid CS1 after the first chemical liquid CS1 is supplied to the first position P1 and before the second chemical liquid CS2 is supplied to the second position P2. In this case, airflow is generated around the metal-containing film MF as the substrate W rotates. This makes it possible to promote the drying of the metal-containing film MF. In addition, it is unnecessary to use another device (such as a blower or a heater) for drying the metal-containing film MF. This makes it possible to simplify the apparatus.

Embodiment 3

The apparatus 1 according to Embodiment 1 or 2 may further include a protection processing part 100 configured to form a protective film PF on the peripheral edge portion Wc of the substrate W, and a protective film cleaning part 400 configured to clean the protective film PF present on the peripheral edge portion Wc of the substrate W. The control part 10 may further execute: controlling the protection processing part 100 so as to form the protective film PF on the peripheral edge portion Wc of the substrate W before the metal-containing film MF is formed on the front surface Wa of the substrate W; and controlling the protective film cleaning part 400 so as to supply a third chemical liquid CS3 having a function of dissolving the protective film PF to the peripheral edge portion Wc of the substrate W after the second chemical liquid CS2 is supplied to the second position P2.

In order to improve the removal performance of the metal component M, for example, it is conceivable that a chemical liquid having high detergency with respect to the metal component M is used as the first chemical liquid CS1 and the second chemical liquid CS2. Meanwhile, there is a risk that the wafer W is eroded by being exposed to the chemical liquid having high detergency with respect to the metal component M. In contrast, according to the present embodiment, the protective film PF is formed prior to the supply of the first chemical liquid CS1, and the second chemical liquid CS2 is supplied prior to the supply of the third chemical liquid CS3 having the function of dissolving the protective film PF. Therefore, at the time of supplying the first chemical liquid CS1 and at the time of supplying the second chemical liquid CS2, the peripheral edge portion Wc of the substrate W is protected by the protective film PF. Accordingly, even in the case where a chemical liquid having high detergency with respect to the metal component M is used as the first chemical liquid CS1 and the second chemical liquid CS2, it is possible to suppress erosion of the substrate W by the first chemical liquid CS1 and the second chemical liquid CS2. Furthermore, the protective film PF is formed prior to the formation of the metal-containing film MF, and the second chemical liquid CS2 is supplied prior to the supply of the third chemical liquid CS3, whereby it is possible to greatly reduce the metal component M remaining on the peripheral edge portion Wc of the substrate W after the protective film PF is removed.

Embodiment 4

In the apparatus 1 according to Embodiment 3, the control part 10 may further execute controlling the protective film cleaning part 400 so as to supply a fourth chemical liquid CS4 used for removing the protective film PF and having a lower hydrogen ion concentration than that of the third chemical liquid CS3 to the peripheral edge portion Wc of the substrate W after the third chemical liquid CS3 is supplied to the peripheral edge portion Wc of the substrate W. A chemical liquid having a strong acidity (namely, a chemical liquid having a relatively high hydrogen ion concentration) is also expected to have high detergency with respect to the metal component M. On the other hand, the chemical liquid having a strong acidity may have low removal performance for the protective film PF. Therefore, as in the apparatus 1 of Embodiment 4, by using the chemical liquid having a lower hydrogen ion concentration than the third chemical liquid CS3 as the fourth chemical liquid CS4 (namely, by using the chemical liquid having a stronger acidity than the fourth chemical liquid CS4 as the third chemical liquid CS3), it is possible to sufficiently remove the protective film PF with the fourth chemical liquid CS4 having a relatively weak acidity, while sufficiently removing the metal component M with the third chemical liquid CS3 having a relatively strong acidity.

Embodiment 5

A substrate processing method according to another embodiment of the present disclosure includes: forming a metal-containing film MF on a front surface Wa of a substrate W; supplying a first chemical liquid CS1 having a function of dissolving the metal-containing film MF to a position P1 of a peripheral edge portion Wc of the substrate W; and supplying a second chemical liquid CS2 having a function of dissolving the metal-containing film MF to a second position P2 being closer to the periphery of the substrate than the first position P1 in the peripheral edge portion Wc of the substrate W. According to the substrate processing method of Embodiment 5, it is possible to obtain the same action and effect as those the apparatus 1 of Embodiment 1.

Embodiment 6

The method according to Embodiment 5 may further include: rotating the substrate W so as to dry the metal-containing film MF dissolved by the first chemical liquid CS1 after the first chemical liquid CS1 is supplied to the first position P1 and before the second chemical liquid CS2 is supplied to the second position P2. With this configuration, it is possible to obtain the same action and effects as those of the apparatus 1 of Embodiment 2.

Embodiment 7

The method according to Embodiment 5 or 6 may further include: forming a protective film PF on the peripheral edge portion Wc of the substrate W before the metal-containing film MF is formed on the front surface Wa of the substrate W; and supplying a third chemical liquid CS3 having a function of dissolving the protective film PF to the peripheral edge portion Wc of the substrate W after the second chemical liquid CS2 is supplied to the second position P2. With this configuration, it is possible to obtain the same action and effect as those of the apparatus 1 of Embodiment 3.

Embodiment 8

The method according to Embodiment 7 may further include: supplying a fourth chemical liquid CS4 having a function of dissolving the protective film PF and having a lower hydrogen ion concentration than that of the third chemical liquid CS3 to the peripheral edge portion Wc of the substrate W after the third chemical liquid CS3 is supplied to the peripheral edge portion Wc of the substrate W. With this configuration, it is possible to obtain the same action and effect as those of the apparatus 1 of Embodiment 4.

Embodiment 9

A computer-readable recording medium (RM) according to another embodiment of the present disclosure stores a program for causing the substrate processing apparatus 1 to execute the method recited in any one of Embodiments 5 to 8. With this configuration, it is possible to obtain the same action and effect as those of the method of any one of Embodiments 5 to 8. In the subject specification, the computer-readable recording medium (RM) includes a non-transitory computer-readable recording medium (for example, various main memory devices or auxiliary memory devices), and a propagated signal (transitory computer-readable recording medium) (for example, a data signal that can be provided via a network).

EXAMPLES

Hereinafter, Examples will be described. However, the present disclosure is not limited to the Examples.

Example 1

A metal-containing resist film MF was formed on a wafer W by the following procedure. First, by executing Steps S11 to S17, a protective film PF was formed on the peripheral edge portion Wc of the wafer W. Subsequently, by executing Steps S21 to S29 described above, a resist film MF was formed on the front surface Wa of the wafer W, and the resist film MF present on the peripheral edge portion Wc of the wafer W was cleansed. Subsequently, by executing a procedure in which Step S43 out of Steps S41 to S48 is omitted, the protective film PF present on the peripheral edge portion Wc of the wafer W was cleaned, and the resist film MF present on the front surface Wa of the wafer W was heated.

Comparative Example 1

A metal-containing resist film MF was formed on a wafer W by the following procedure. First, by executing Steps S11 to S17, a protective film PF was formed on the peripheral edge portion Wc of the wafer W. Subsequently, by executing a procedure in which Steps S26 and S27 out of Steps S21 to S29 are omitted, a resist film MF was formed on the front surface Wa of the wafer W and the resist film MF present on the peripheral edge portion Wc of the wafer W was cleaned. Subsequently, by executing a procedure in which Step S43 out of Steps S41 to S48 is omitted, the protective film PF present on the peripheral edge portion Wc of the wafer W was cleaned, and the resist film MF present on the front surface Wa of the wafer W was heated.

(Evaluation Method of Residual Amount of Metal Component)

A residual amount of a metal component M was evaluated with respect to the wafers W of Example 1 and Comparative Example 1 by the following procedure. First, the outermost surface of the peripheral edge portion Wc of the wafer W was brought into contact with an acid by a horizontal type substrate inspection apparatus. The entire amount of the liquid obtained by the contact with the acid was collected, and the collected liquid was used as a measurement reagent liquid. The measurement reagent liquid was measured by inductively coupled plasma mass spectrometry (ICP-MS). The mass obtained by such a measurement was converted into the number of atoms and was divided by the contacted area to convert the number of atoms into the number of atoms per unit area. In Example 1 and Comparative Example 1, the residual amount of the metal components M on each of the end surface Wb and the back surface Wd (see FIG. 18B) of the peripheral edge portion Wc of the wafer W was evaluated.

(Evaluation Result of Residual Amount of Metal Component)

Figure 19A:
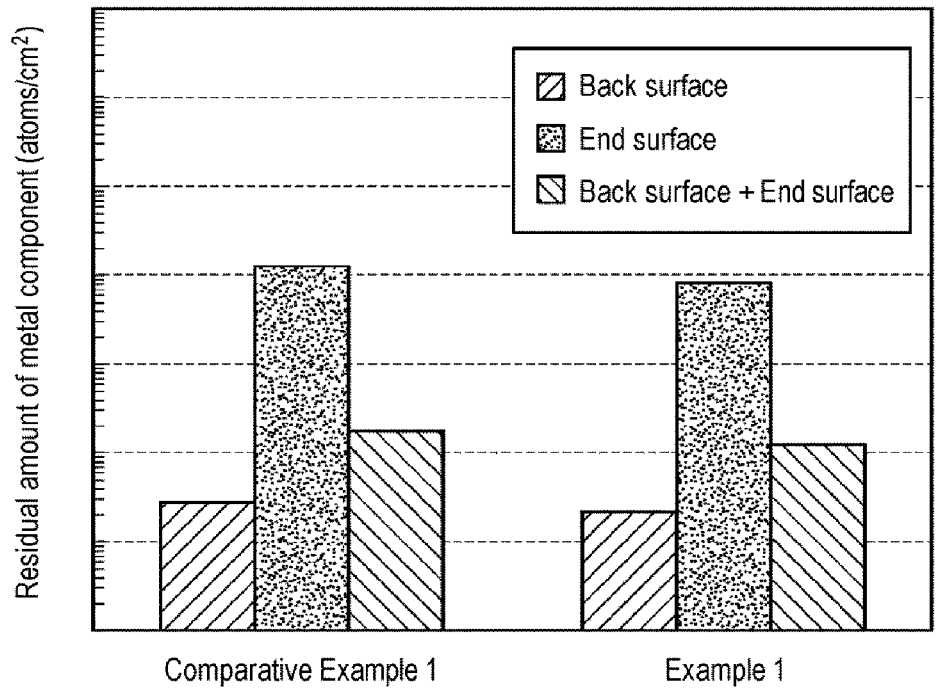
FIGS. 19A and 19B are graphs showing comparison results of residual amounts of metal components.

As shown in FIG. 19A, it was confirmed that, on the back surface Wd, the end surface Wb and the back surface Wd+the end surface Wb, the metal component M remaining on the peripheral edge portion Wc can be reduced in Example 1 as compared with Comparative Example 1.

Example 2

A metal-containing resist film MF was formed on a wafer W in the same procedure as in Example 1 except that Step S43 out of Steps S41 to S48 is not omitted and Step S44 is omitted.

Comparative Example 2

A metal-containing resist film MF was formed on a wafer W in the same procedure as in Comparative Example 1 except that Step S43 out of Steps S41 to S48 is not omitted and Step S44 is omitted.

(Evaluation Result of Residual Amount of Metal Component)

Figure 19B:
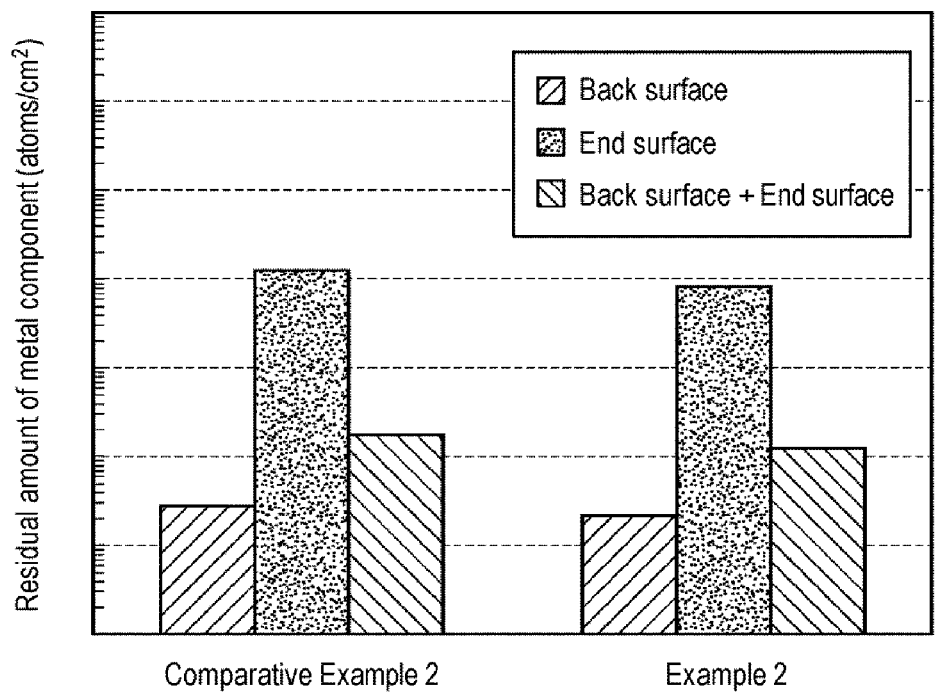

With respect to the wafers W of Example 2 and Comparative Example 2, a residual amount of a metal component M was evaluated in the same procedure as in Example 1 and Comparative Example 1. As a result, as shown in FIG. 19B, it was confirmed that, on the end surface Wb and the back surface Wd+the end surface Wb, the metal component M remaining on the peripheral edge portion We can be reduced in Example 2 as compared with Comparative Example 2.

Example 3

A metal-containing resist film MF was formed on a wafer W in the same procedure as in Example 1 except that Step S43 out of Steps S41 to S48 is not omitted but changed to Step S44. That is to say, in Example 3, Step S44 was performed twice. In the first round of Step S44, the supply time of the fourth chemical liquid CS4 was set to 13 seconds. In the second round of Step S44, the supply time of the fourth chemical liquid CS4 was set to 5 seconds.

Example 4

A metal-containing resist film MF was formed on a wafer W in the same procedure as in Example 2 except that Step S44 out of Steps S41 to S48 is not omitted but changed to Step S43. That is to say, in Example 4, Step S43 was performed twice. In the first round of Step S43, the supply time of the third chemical liquid CS3 was set to 13 seconds. In the second round of Step S43, the supply time of the third chemical liquid CS3 was set to 5 seconds.

Example 5

A metal-containing resist film MF was formed on a wafer W in the same procedure as in Examples 1 to 4 except that all Steps S41 to S48 are executed without being changed and omitted. In Step S43, the supply time of the third chemical liquid CS3 was set to 13 seconds. In Step S44, the supply time of the fourth chemical liquid CS4 was set to 5 seconds.
(Evaluation Method of Residue of Protective Film)

Residues of the protective film PF were evaluated with respect to the wafers W of Examples 3 to 5 by the following procedure. First, an image (captured image) of the end surface Wb of the wafer W before coating the protective film PF and an image (captured image) of the end surface Wb (see FIG. 8B) of the wafer W after cleaning the protective film PF were acquired by a macro inspection device dedicated to a wafer end portion. Subsequently, the acquired images were compared with each other, and the number of increased residues was counted. In Examples 3 to 5, the residues of the protective film PF were evaluated with respect to three sheets of wafers W.
(Evaluation Result of Residue of Protective Film)

Figure 20:
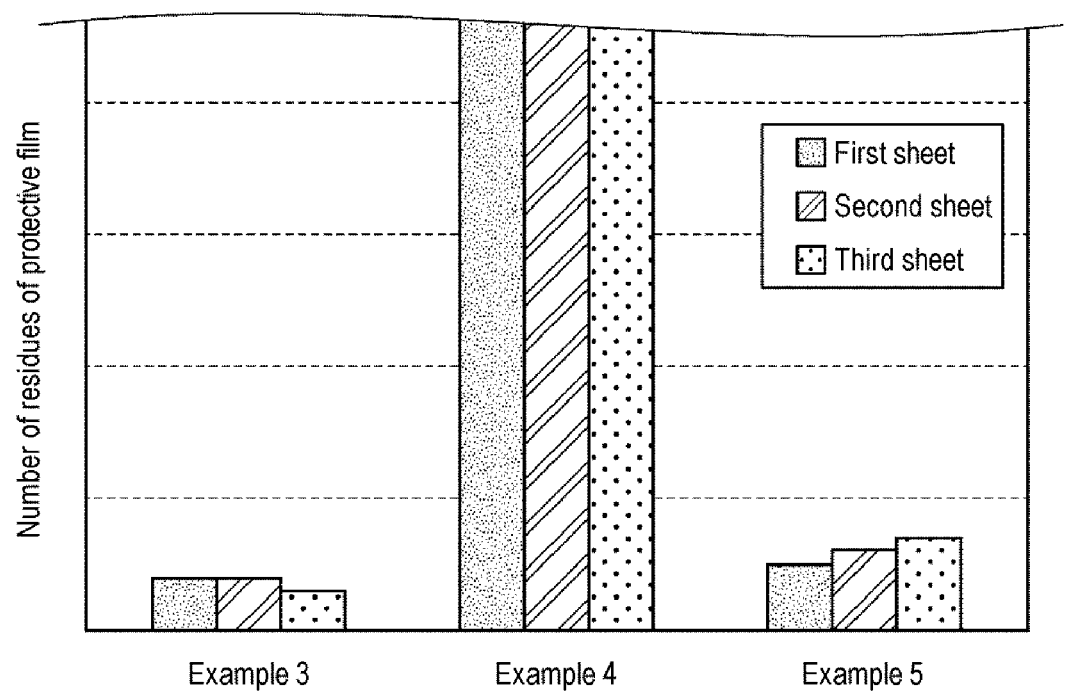
FIG. 20 is a graph showing a comparison result of the number of residues of a protective film.

As shown in FIG. 20, it was confirmed that, in any of the first, second and third sheets, the residues of the protective film PF remaining on the peripheral edge portion Wc (the end surface Wb) can be most reduced in Example 3. On the other hand, it was confirmed that, even in Example 5, the residues of the protective film PF remaining on the peripheral edge portion Wc (the end surface Wb) can be reduced by the same degree as in Example 3. In the case of Example 4, in any of the first, second, and third sheets, the number of residues of the protective film PF was remarkably large as compared with Example 3 and Example 5. Thus, the measurement could not be performed.

Example 6

A metal-containing resist film MF was formed on a wafer W in the same procedure as in Example 3.

Example 7

A metal-containing resist film MF was formed on a wafer W in the same procedure as in Example 4.

Example 8

A metal-containing resist film MF was formed on a wafer W in the same procedure as in Example 5.
(Evaluation Result of Residual Amount of Metal Component)

Figure 21:
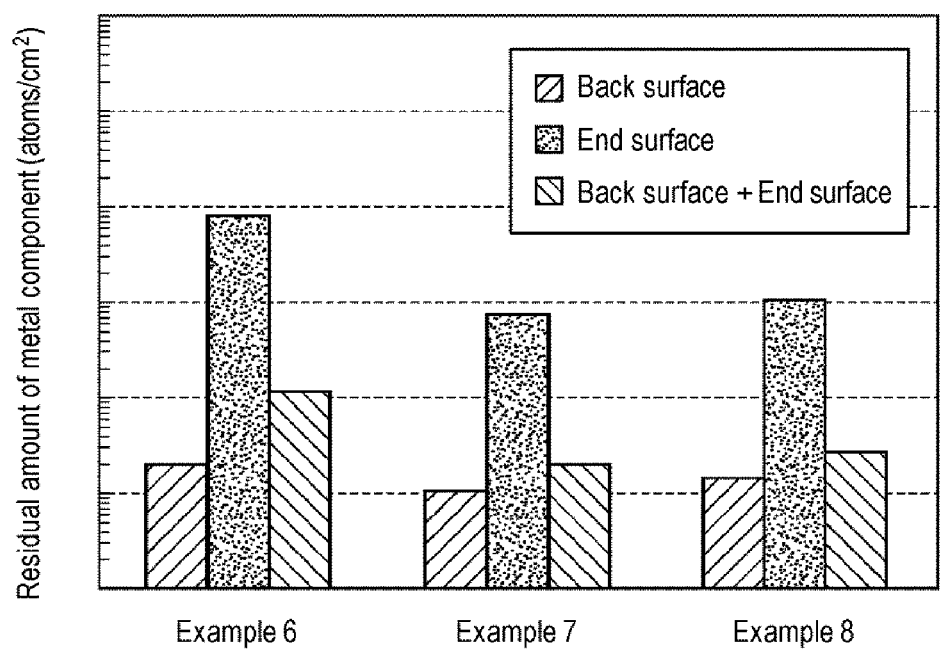
FIG. 21 is a graph showing a comparison result of residual amounts of metal components.

Residual amounts of a metal component M were evaluated with respect to the wafers W of Examples 6 to 8 in the same procedure as in Examples 1 and 2 and Comparative Examples 1 and 2. As a result, as shown in FIG. 21, it was confirmed that, on the back surface Wd, the end surface Wb and the back surface Wd+the end surface Wb, the metal component M remaining on the peripheral edge portion Wc can be most reduced in Example 7. In contrast, in the case of Example 6, it was confirmed that the metal component M remaining on the peripheral edge portion Wc is left in the largest amount. On the other hand, in the case of Example 8, it was confirmed that it is possible to reduce the metal component M remaining on the peripheral edge portion Wc by the same degree as in Example 6.

From the forgoing, as shown in FIGS. 20 and 21, it was confirmed that, in the case where all Steps S41 to S48 are performed without changing and omitting any of them as in Examples 5 and 8, it is possible to reduce both the number of residues of the protective film PF and the metal component M.

According to the substrate processing apparatus, the substrate processing method and the non-transitory computer-readable recording medium of the present disclosure, it is possible to suppress metal contamination attributable to the use of a metal-containing film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
   forming a metal-containing film on a front surface of a substrate;
   supplying a first chemical liquid having a function of dissolving the metal-containing film to a first position in a peripheral edge portion of the substrate; and
   supplying a second chemical liquid having a function of dissolving the metal-containing film to a second position in the peripheral edge portion of the substrate after the metal-containing film dissolved by the first chemical liquid is dried, the second position being closer to a periphery of the substrate than the first position,
   wherein forming a protective film on the peripheral edge portion of the substrate is performed before the metal-containing film is formed on the front surface of the substrate; and
   wherein supplying a third chemical liquid having a function of dissolving the protective film to the peripheral edge portion of the substrate is performed after the second chemical liquid is supplied to the second position.

2. The method of claim 1, further comprising:
   rotating the substrate so as to dry the metal-containing film dissolved by the first chemical liquid after the first chemical liquid is supplied to the first position and before the second chemical liquid is supplied to the second position.

3. The method of claim 1, further comprising:
   supplying a fourth chemical liquid having a function of dissolving the protective film and having a lower hydrogen ion concentration than a hydrogen ion concentration of the third chemical liquid to the peripheral edge portion of the substrate after the third chemical liquid is supplied to the peripheral edge portion of the substrate.

* * * * *